US006952035B2

(12) United States Patent
Yoshida et al.

(10) Patent No.: US 6,952,035 B2
(45) Date of Patent: Oct. 4, 2005

(54) SEMICONDUCTOR DEVICE OF NON-VOLATILE MEMORY

(75) Inventors: Masaaki Yoshida, Hyogo-ken (JP); Hiroaki Nakanishi, Hyogo-ken (JP)

(73) Assignee: Ricoh Company, Ltd. (JP)

( * ) Notice: Subject to any disclaimer, the term of this patent is extended or adjusted under 35 U.S.C. 154(b) by 36 days.

(21) Appl. No.: 10/703,449

(22) Filed: Nov. 10, 2003

(65) Prior Publication Data

US 2004/0113197 A1 Jun. 17, 2004

(30) Foreign Application Priority Data

Nov. 8, 2002 (JP) ........................................ 2002-325649

(51) Int. Cl.$^7$ ............................................. H01L 29/788
(52) U.S. Cl. ........................ 257/315; 257/314; 257/316; 257/320; 257/321; 257/322; 257/326; 438/201; 438/211; 438/257; 438/266
(58) Field of Search ................................ 257/239, 261, 257/295, 298, 314–326; 438/201, 211, 216, 241, 257, 258, 260–266, 591, 593

(56) References Cited

U.S. PATENT DOCUMENTS 5,427,970 A * 6/1995 Hsue et al. ................. 438/261

6,566,707 B1 * 5/2003 Sudo et al. .................. 257/316

FOREIGN PATENT DOCUMENTS

| JP | 4-80544 | 12/1992 |
| JP | 6-85275 | 3/1994 |
| JP | 8-506693 | 7/1996 |

* cited by examiner

*Primary Examiner*—Andy Huynh
(74) *Attorney, Agent, or Firm*—Dickstein Shapiro Morin & Oshinsky LLP

(57) ABSTRACT

A non-volatile memory semiconductor device includes a first insulation layer, two diffusion regions, a memory gate oxide layer, a first control gate, a second insulation layer, a floating gate of polysilicon, a third insulation layer and a second control gate. The first insulation layer is formed on a semiconductor substrate. The two diffusion regions are formed on a surface of the substrate. The memory gate oxide layer is formed over the two diffusion regions on the substrate. The first control gate including a diffusion region is formed on the surface of the substrate. The second insulation layer is formed on the first control gate. The floating gate of polysilicon is formed over the memory gate oxide layer, the first insulation layer, and the second insulation layer. The third insulation layer is formed on the floating gate. The second control gate is disposed on the floating gate.

5 Claims, 29 Drawing Sheets

SEMICONDUCTOR DEVICE OF NON-VOLATILE MEMORY

This patent specification is based on Japanese patent application, No. 2002-325649 filed on Nov. 8, 2002 in the Japanese Patent Office, which is hereby incorporated by reference in its entirety.

FIELD OF THE INVENTION

The present invention relates to a semiconductor device and, in particular, to a semiconductor device of a non-volatile memory.

BACKGROUND OF THE INVENTION

A non-volatile memory referred to as EEPROM (Electrically Erasable Programmable Random Access Memory) includes two major types; a single layer gate and a two-layer gate, depending upon the number of gates. One exemplary single layer gate is described in Japanese Laid-Open Patent Application Publication No. 6-085275 and Japanese Patent Application Publication No. Kou-Hyo 8-506693. One exemplary two-layer gate is described in Unexamined Japanese Patent Publication No. 4-080544.

FIG. 1 is a plan view illustrating an example of a conventional single layer gate non-volatile memory. A P-type semiconductor substrate (hereinafter referred to as a P-substrate) 101 has N-type diffusion regions 103, 105, 107 and a control gate 109 including N-type diffusion regions formed thereon. The N-type diffusion regions 103 and 105 are spaced from each other. The N-type diffusion regions 105 and 107 are also spaced from each other.

A select gate 111 of polysilicon is formed over the surface of the P-substrate 101 and portions of the surface of the N-type diffusion regions 103 and 105 through a gate oxide layer.

A floating gate 113 of polysilicon is continuously formed over the surface of the P-substrate 101 including the region between the N-type diffusion regions 105 and 107 and over the control gate 109 through a silicon oxide layer (not shown). In the region near the N-type diffusion regions 105 and 107, the floating gate 113 overlaps with the N-type diffusion regions 105 and 107 through a memory gate oxide layer.

In order to erase the single layer gate non-volatile memory, that is, implant electrons into the floating gate 113, the N-type diffusion region 103 is set to 0 volts, the N-type diffusion region 107 is set to a predetermined potential Vpp, and the control gate 109 and the select gate 111 are set to the predetermined potential Vpp. As a result, a select transistor including the N-type diffusion regions 103, 105 and the select gate 111 is turned ON to implant electrons from the N-type diffusion region 105 into the floating gate 113 through the memory gate oxide layer.

In order to write the single layer gate non-volatile memory, that is, emit electrons from the floating gate 113, the control gate 109 is set to 0 volts, the N-type diffusion region 107 is set into an open state, and the N-type diffusion region 103 and the select gate 111 are set to the predetermined potential Vpp. As a result, the select transistor including the N-type diffusion regions 103 and 105 and the select gate 111 is turned ON to extract electrons injected to the floating gate 113 into the N-type diffusion region 105 tunneling through the memory gate oxide layer.

In the single layer gate non-volatile memory, the control gate 109 formed by the diffusion region and the floating gate 113 of polysilicon are widely overlapped with each other on the plane of the substrate, thereby providing a high coupling ratio.

FIG. 2 is a plan view of a conventional two-layer gate non-volatile memory. N-type diffusion regions 117 and 119 are spaced on the P-substrate 101 from each other. A floating gate 123 of polysilicon is formed on a portion of the surfaces of the P-substrate 101 and portions of the surface of the N-type diffusion regions 117 and 119 through a memory gate oxide layer 121. The floating gate 123 has a control gate 127 of polysilicon formed thereon through a silicon oxide layer 125.

In order to erase the two-layer gate non-volatile memory, that is, implant electrons into the floating gate 123, the N-type diffusion region 119 is set to 0 volts, the N-type diffusion region 117 is set to a predetermined potential Vpp, and the control gate 127 is set to the predetermined potential Vpp. As a result, electrons are implanted from the N-type diffusion region 119 into the floating gate 123 through the memory gate oxide layer 121.

In order to write the two-layer gate non-volatile memory, that is, emit electrons from the floating gate 123, the control gate 127 is set to 0 volts, the N-type diffusion region 117 is set into an open state, and the N-type diffusion region 119 is set to the predetermined potential Vpp. As a result, electrons injected to the floating gate 123 are extracted into the N-type diffusion region 119 tunneling through the memory gate oxide layer 121.

All existing techniques, however, possess their own distinct disadvantages. The single-layer gate non-volatile memory provides a high coupling ratio so that memory is rewritten at relatively less voltage. However, the non-volatile memory occupies a significant with memory cell area on a substrate.

On the other hand, the two-layer gate non-volatile memory occupies less unit memory cell area on the substrate. However, its relatively small coupling ratio requires a large voltage in comparison with the single-layer gate non-volatile memory.

The semiconductor device having a non-volatile memory often includes a select transistor for a high voltage to rewrite a memory. In conventional techniques, a select transistor requires an increase in a thickness of a gate oxide layer and a double diffusion drain structure for a high breakdown voltage.

However, a high voltage of a memory-rewriting requires a long diffusion length extending in a direction of a drain depth to relieve an electric field in a high voltage transistor. In addition, the drain needs to be extracted from a region for device isolation to provide a high withstand voltage. Thus, the above-mentioned techniques have a number of these limitations which lead to a problem of an increase in the unit memory cell area.

SUMMARY OF THE INVENTION

In one embodiment, a novel non-volatile memory semiconductor device includes a first insulation layer, two diffusion regions, a memory gate oxide layer, a first control gate, a second insulation layer, a floating gate of polysilicon, a third insulation layer and a second control gate. The first insulation layer is formed on a semiconductor substrate. The two diffusion regions are formed on a surface of the semiconductor substrate spaced from each other. The memory gate oxide layer is formed over the two diffusion regions on the semiconductor substrate between the two diffusion regions. The first control gate electrically separated from the two diffusion regions and including a diffusion region is formed on the surface of the semiconductor substrate. The second insulation layer is formed on the first control gate. The floating gate of polysilicon is formed over the memory gate oxide layer, the first insulation layer, and the second insulation layer. The third insulation layer is formed on the floating gate. The second control gate is disposed on the floating gate electrically connected to the first control gate through the third insulation layer.

The above-mentioned non-volatile memory semiconductor device may further include a fourth insulation layer. In this non-volatile memory semiconductor, the floating gate may be disposed under a portion of the second control gate through the fourth insulation layer.

The third insulation layer may include a multilayer film including a plurality of layers including at least one silicon nitride layer.

The multilayer film of the third insulation layer may include a silicon oxide layer, a silicon nitride layer, a silicon oxide layer sequentially in this order from bottom to top with the silicon oxide layer formed on side surfaces of the floating gate.

The above-mentioned non-volatile memory semiconductor device may further include a tunneling oxide layer having a thickness less than the memory gate oxide layer which is provided on one of the two diffusion regions. In this non-volatile memory semiconductor device, a portion of the floating gate is formed on the tunneling oxide layer.

Further, in one embodiment, a novel method of forming a non-volatile memory semiconductor device includes the steps of first forming, second forming, third forming, electrically separating, fourth forming, fifth forming, sixth forming, and disposing. The first forming step forms a first insulation layer on a semiconductor substrate. The second forming step forms two diffusion regions on a surface of the semiconductor substrate spaced from each other. The third forming step forms a memory gate oxide layer over the two diffusion regions on the semiconductor substrate between the two diffusion regions. The electrically separating step separates a first control gate from two diffusion regions and forming a diffusion region on the surface of the semiconductor substrate. The fourth forming step forms a second insulation layer on the first control gate. The fifth forming step forms a floating gate of polysilicon over the memory gate oxide layer, the first insulation layer, and the second insulation layer. The sixth forming step forms a third insulation layer on the floating gate, and the disposing steps disposes a second control gate on the floating gate electrically connected to the first control gate through the third insulation layer.

The above-mentioned method may further include a fourth insulation layer. In this method, the floating gate may be formed in the fifth forming step under a portion of the second control gate through the fourth insulation layer.

In this method, the third insulation layer may include a multilayer film including a plurality of layers including at least one silicon nitride layer.

In this method, the multilayer film of the third insulation layer may include a silicon oxide layer, a silicon nitride layer, a silicon oxide layer sequentially in this order from bottom to top with the silicon oxide layer formed on side surfaces of the floating gate.

The above-mentioned method may further include a tunneling oxide layer having a thickness less than the memory gate oxide layer which is provided on one of the two diffusion regions. In this method, a portion of the floating gate may be formed on the tunneling oxide layer.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, in which.

DETAILED DESCRIPTION OF PREFERRED EMBODIMENTS

Figure 1:
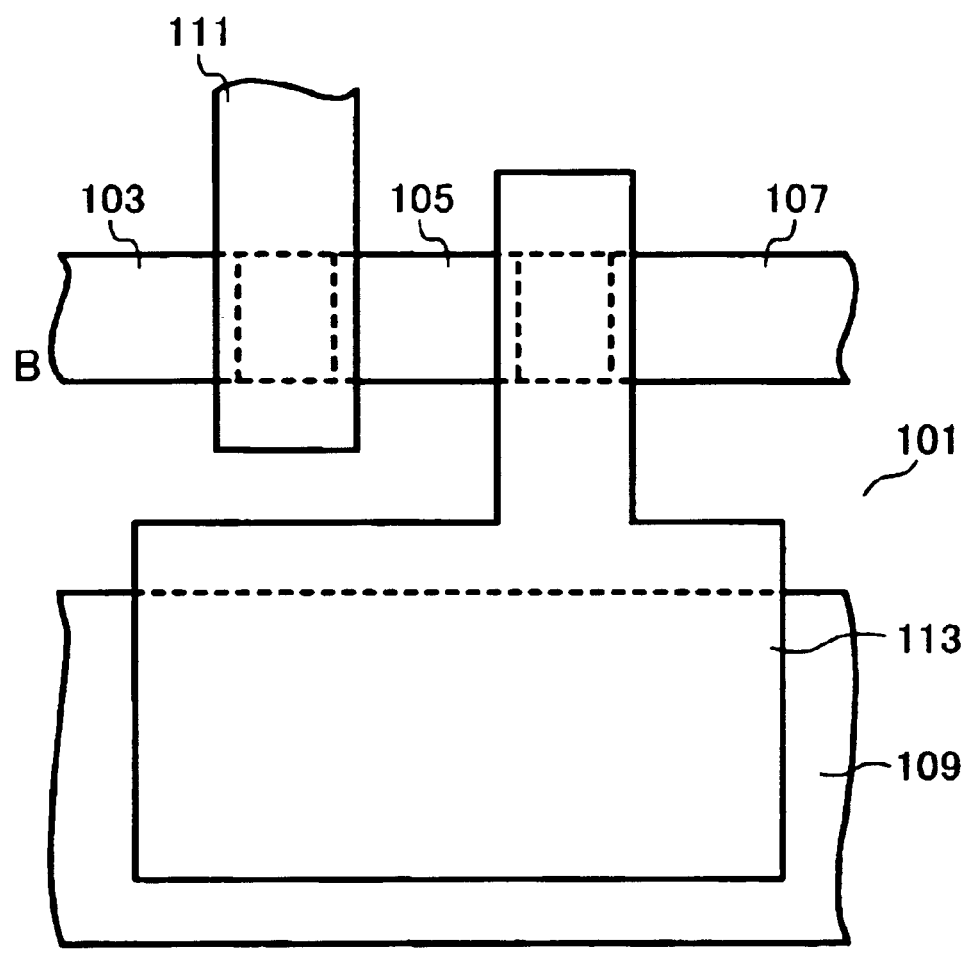
FIG. 1 is a plan view illustrating an example of a conventional single layer gate non-volatile memory.
Figure 2:
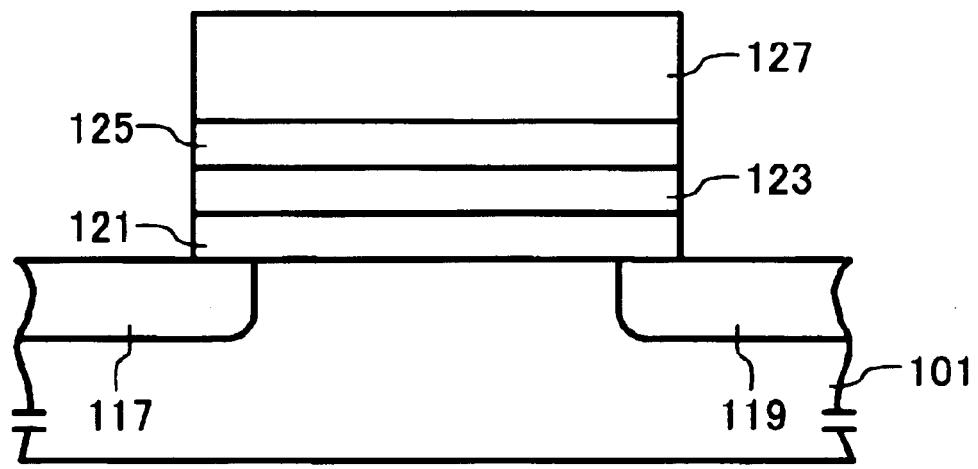
FIG. 2 is a plan view illustrating an example of a conventional two-layer gate non-volatile memory.

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner. Referring now to the drawings, wherein like reference numerals designate identical or corresponding parts throughout the several views, particularly to FIGS. 3A–3D, an exemplary semiconductor device according to a preferred embodiment of the present invention is now described.

Figure 3A:
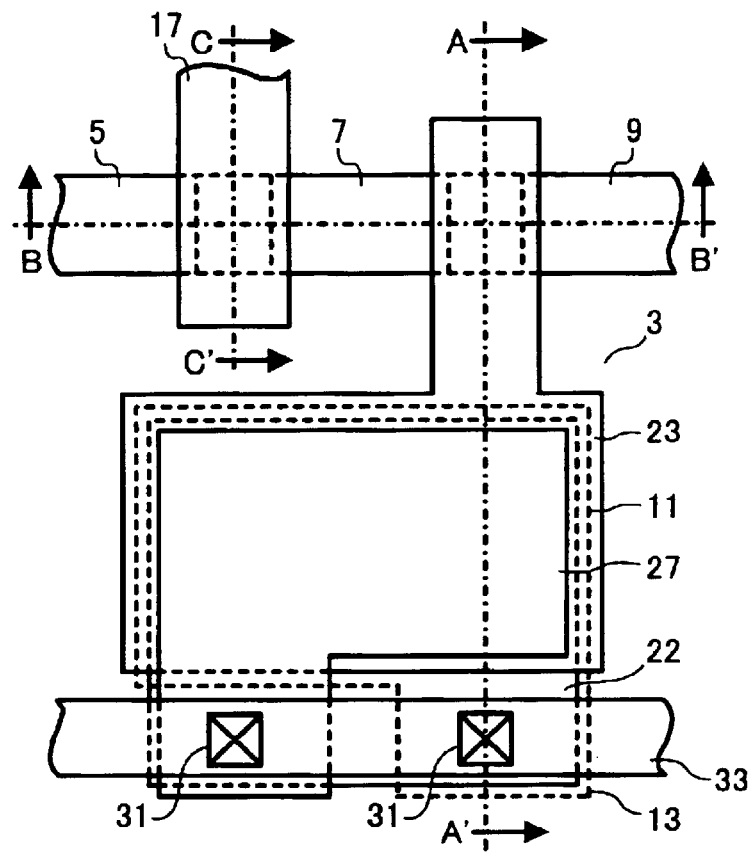
FIGS. 3A–3D are views illustrating an embodiment according to the present invention.
Figure 3B:
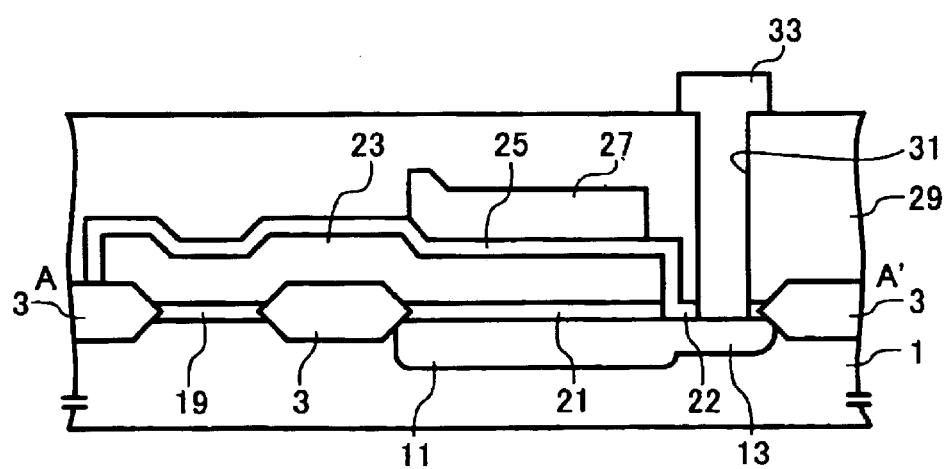
Figure 3C:
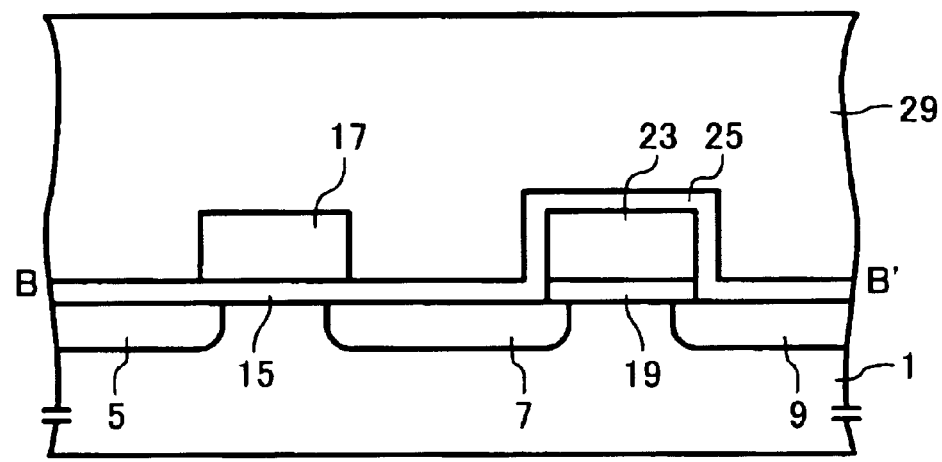
Figure 3D:
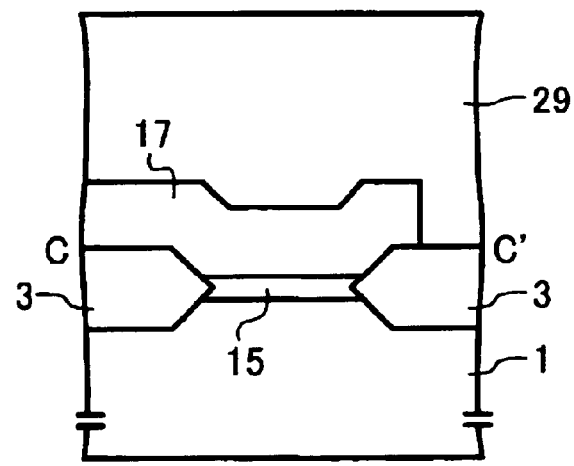

FIG. 3A is a plan view of a substrate of the semiconductor device. FIG. 3B is a sectional view taken along line A–A' of FIG. 3A. FIG. 3C is a sectional view taken along line B–B' of FIG. 3A. FIG. 3D is a sectional view taken along line C–C' of FIG. 3A.

On a surface of a P-substrate (i.e., a semiconductor substrate of a first conductivity type) 1, a field oxide layer (i.e., a first insulating layer) 3 is formed for device isolation. An allowable thickness range of the field oxide layer is between about 4500 and about 7000 Å. In this embodiment, the field oxide layer has a thickness of about 5000 Å, for example. N-type diffusion regions 5, 7 and 9 are formed on regions of the P-substrate 1 surrounded by the field oxide layer 3. The N-type diffusion regions 5 and 7 are spaced from each other, while the N-type diffusion regions 7 and 9 are also spaced from each other. In addition, the P-substrate 1 has a first control gate 11 and an N-type diffusion region 13 formed thereon. The first control gate 11 includes N-type diffusion regions electrically isolated from the N-type diffusion regions 5, 7 and 9. The N-type diffusion region 13 is electrically connected to the first control gate 11.

A select transistor gate oxide layer 15 is formed on a portion of the surface of the P-substrate 1 and portions of the surface of the N-type diffusion regions 5 and 7. An allowable thickness range of the select transistor gate oxide layer is between about 200 and about 600 Å. In this embodiment, the select transistor gate oxide layer 15 has a thickness of about 400 Å, for example. A polysilicon select gate 17 is formed on the select transistor gate oxide layer 15. An allowable thickness range of the polysilicon select gate 17 is between about 2500 and about 4500 Å. In this embodiment, the polysilicon select gate 17 has a thickness of about 3500 Å, for example.

A gate oxide layer 19 for memory is formed on the surface of the P-substrate 1 and portions of the surface of the N-type diffusion regions 7 and 9. An allowable thickness range of the gate oxide layer 19 is between about 80 and about 110 Å. In this embodiment, the gate oxide layer 19 has a thickness of about 100 Å, for example. The gate oxide layer 19 also acts as a tunnel oxide layer.

A silicon oxide layer 21 (i.e., a second insulting layer) is formed on the first control gate 11. An allowable thickness range of the silicon oxide layer 21 is between about 200 and about 600 Å. In this embodiment, the silicon oxide layer 21 has a thickness of about 400 Å, for example. A silicon oxide layer 22 is formed on the N-type diffusion region 13. An allowable thickness range of the silicon oxide layer 22 is between about 200 and about 600 Å. In this embodiment, the silicon oxide layer 22 has a thickness of about 400 Å, for example.

A polysilicon floating gate 23 is formed over the silicon oxide layer 21 on the first control gate 11, the field oxide layer 3, and the memory gate oxide layer 19. An allowable thickness range of the polysilicon floating gate 23 is between about 2500 and about 4500 Å. In this embodiment, the polysilicon floating gate 23 has a thickness of about 3500 Å, for example. A silicon oxide layer 25 (i.e., third and fourth insulting layers) is formed on the upper and side surfaces of the floating gate 23. An allowable thickness range of the silicon oxide layer 25 is between about 150 and about 500 Å. In this embodiment, the silicon oxide layer 25 has a thickness of about 250 Å, for example.

A second polysilicon control gate 27 is formed over the silicon oxide layer 25 on the floating gate 23 and the silicon oxide layer 22. An allowable thickness range of the second polysilicon control gate 27 is between about 2500 and about 4500 Å. In this embodiment, the second polysilicon control gate 27 has a thickness of about 3500 Å, for example. A portion of a side of the floating gate 23 is disposed under a portion of the second control gate 27 with the silicon oxide layer 25 therebetween.

A polysilicon-metal interlayer 29 of a silicon oxide layer is formed over the P-substrate 1, the upper portion of the field oxide layer 3, the N-type diffusion regions 5, 7, 9 and 13, the first control gate 11, the select gate 17, the floating gate 23 and the second control gate 27. An allowable thickness range of the polysilicon-metal interlayer 29 is between about 5000 and about 10000 Å. In this embodiment, the polysilicon-metal interlayer 29 has a thickness of about 8000 Å, for example.

Contact holes 31 are formed through the polysilicon-metal interlayer 29, and the silicon oxide layer 21 on the N-type diffusion region 13, and through the polysilicon-metal interlayer 29 on the second control gate 27 disposed on the silicon oxide layer 22. A conductive material 33 such as aluminum is formed inside the contact hole 31 and on a predetermined region within the polysilicon-metal interlayer 29. The conductive material 33 electrically connects the first control gate 11 to the second control gate 27.

In this embodiment, the floating gate 23 is sandwiched between two control gates 11 and 27, thus providing a high coupling ratio at a smaller area contrary to conventional techniques. In addition, it is possible to rewrite memory at a low voltage in comparison with the conventional single and two-layer gates.

Further, memory writing in the state of a low voltage simplifies a structure of the select transistor, thereby reducing a chip area of the device and improving the process selectivity.

Figure 4:
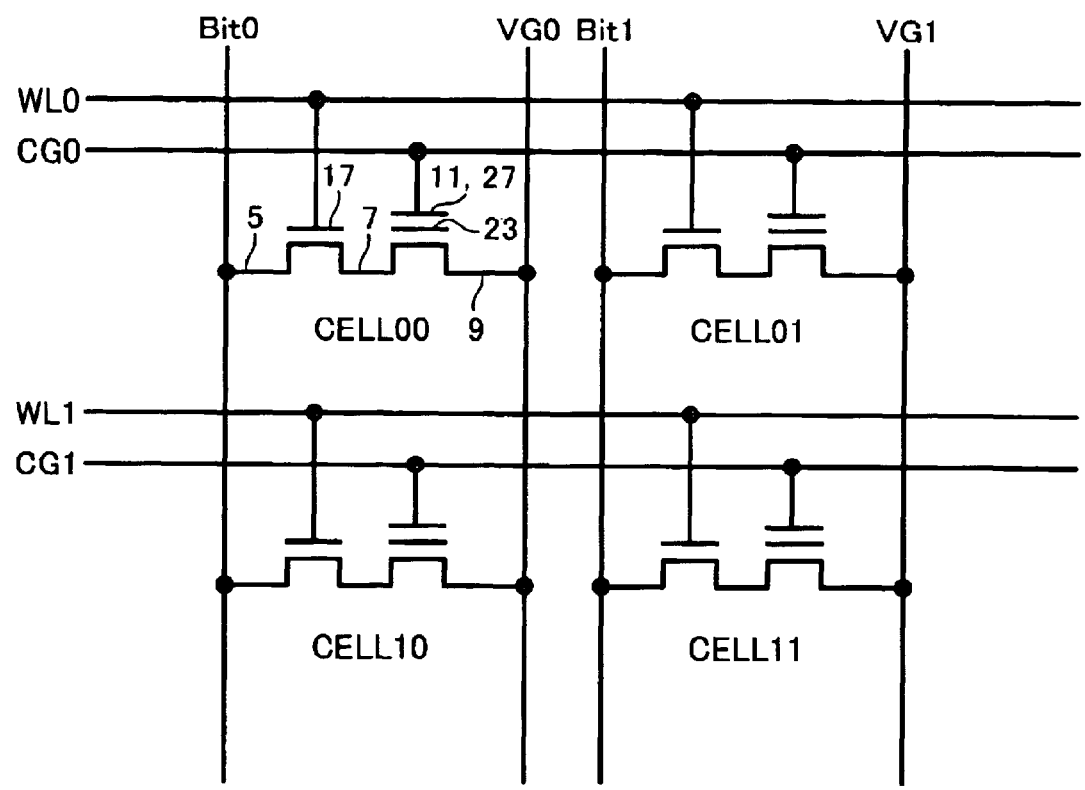
FIG. 4 is a circuit diagram with a non-volatile memory device of an embodiment of the present invention arranged in a matrix form.

FIG. 4 is a circuit diagram of the non-volatile memory device according to the embodiment of the present invention shown in FIGS. 3A–3D. The non-volatile memory device of FIG. 4 includes a plurality of memory cells including four memory cells 00, 01, 10 and 11, for example, arranged in a matrix form.

The select gates 17 of memory cells i0, i1, . . . , and in, arranged side by side in a lateral direction (i.e., a word line direction WL) are electrically connected to a common word line WLi, while the control gates 11 and 27 are electrically connected to a common control gate line CGi. In this instance, i is 0 or natural number and n is 0 or natural number.

The N-type diffusion regions 5 of memory cells 0i, 1i, . . . , and in, arranged one over another in a vertical direction (i.e., a bit line direction Bit) are electrically connected to a common bit line Biti, while the N-type diffusion regions 9 are electrically connected to a common virtual ground line VGi. In this instance, i is 0 or natural number and n is 0 or natural number.

For example, when memory cells 00, 01, . . . , and 0n arranged side by side in the word line direction are erased, each terminal is biased as shown in Table 1.

TABLE 1

Bias condition at the time of erasing

|  | BIT0 = 0 V | VG0 = Open | BIT1 = 0 V | VG1 = Open |
|---|---|---|---|---|
| WL0 = Vpp | Erase (High Vth) |  | Erase (High Vth) |  |
| CG0 = Vpp |  | (cell 00) |  | (cell 01) |
| WL1 = 0 V | Retain |  | Retain |  |
| CG1 = 0 V |  | (cell 10) |  | (cell 11) |

The word line WL0 and the control gate line CG0 connected to a block of memory cells to be erased are biased to the predetermined potential Vpp. Other word lines WLi and the control gate lines CGi are biased to 0 volts. All bit lines Biti are biased to 0 volts. All VG lines VGi are set into an open state. This setting injects electrons to the floating gate 23 of the memory cells 00, 01, . . . , and 0n connected to the word line WL0 and the control gate line CGo through the memory gate oxide layer and erases the cells in each block as a group at the same time. At this time, a block of the remaining memory cells connected to the word line WLi and the control gate line CGi both are biased to 0 volts and are not erased.

For example, when the memory cell 00 is written, each terminal is biased as shown in Table 2.

TABLE 2

Bias condition at the time of writing

|  | BIT0 = Vpp | VG0 = Open | BIT1 = 0 V | VG1 = Open |
|---|---|---|---|---|
| WL0 = Vpp | Write (Dep) |  | Non-write (High Vth) |  |
| CG0 = 0 V |  | (cell 00) |  | (cell 01) |
| WL1 = 0 V | Retain |  | Retain |  |
| CG1 = 0 V |  | (cell 10) |  | (cell 11) |

All control gate lines CGi are biased to 0 volts. The word line WL0 connected to the memory cell 00 for writing and the bit line Bit0 are biased to the predetermined potential Vpp. Other word lines WLi and other bit lines Biti are biased to 0 volts. All VG lines VGi are set into an open state. This setting extracts electrons injected to the floating gate 23 of the memory cell 00 into the N-type diffusion layer 7 tunneling through the memory gate oxide layer so that the memory cell 00 may be selectively written.

In the embodiment shown in FIGS. 3A–3D, the select gate 17 may be formed at the same time or not at the same time the second control gate 27 or the floating gate 23 is formed. One exemplary manufacturing process for forming the select gate 17 simultaneously with the second control gate 27 will be now described.

Referring to FIGS. 3A–3D, 5A–5G, and 6A–6G, the manufacturing process will be described. FIGS. 5A–5G and 6A–6G are cross-sectional views for explaining an exemplary manufacturing process of the embodiment shown in FIGS. 3A–3D. FIGS. 5A–5G are sections taken along line A–A' of FIG. 3A. FIGS. 6A–6G and are sections taken along line B-B' of FIG. 3A.

In Step 1, the field oxide layer 3 is formed on the P-substrate 1 by a normal LOCOS (local oxidation of silicon) method to separate element from the P-substrate 1. A sacrificial oxide layer 35 having a thickness of, for example, 250 to 400 Å is formed on a surface of the P-substrate 1 uncovered with the field oxide layer 3. A resist pattern 37 having an opening corresponding to a region in which a first control gate is formed, is formed by photolithography techniques (refer to FIGS. 5A and 6A).

Figure 5A:
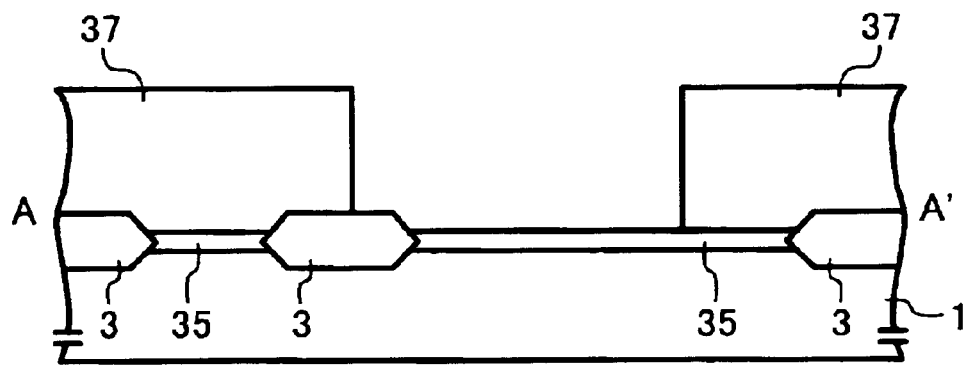
FIGS. 5A–5D are cross-sectional views for explaining an example of a first half of manufacturing processes of the embodiment shown in FIGS. 3A–3D.
Figure 5B:
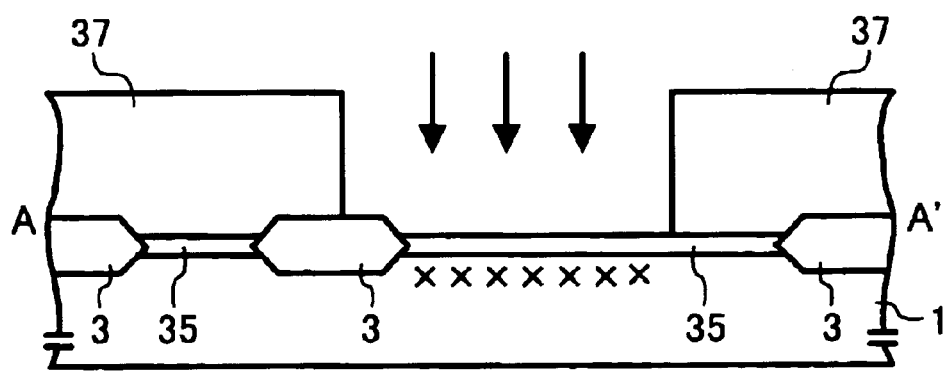
Figure 5C:
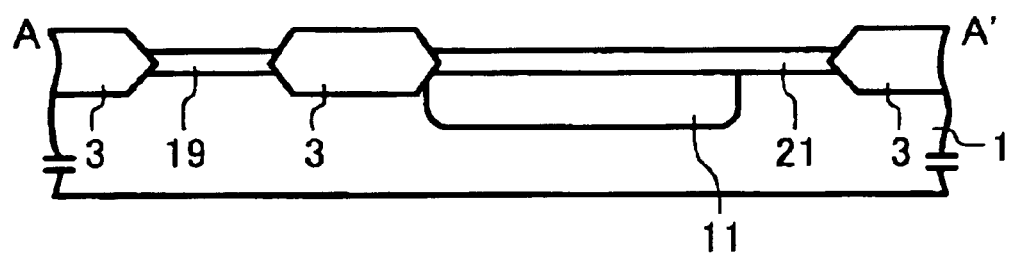
Figure 5D:
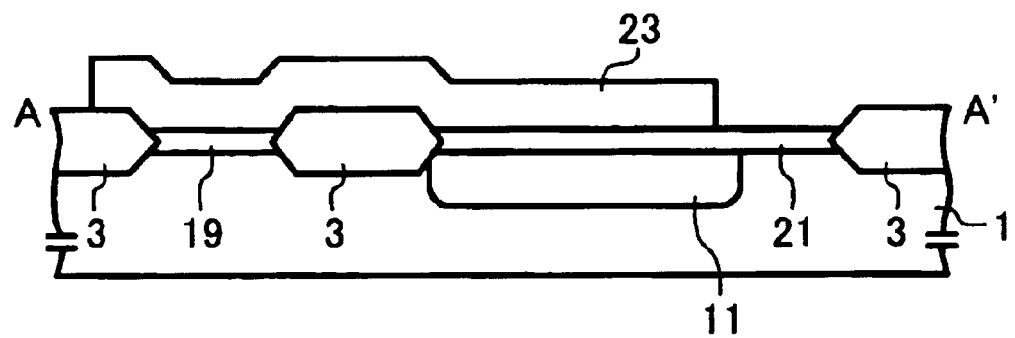
Figure 6A:
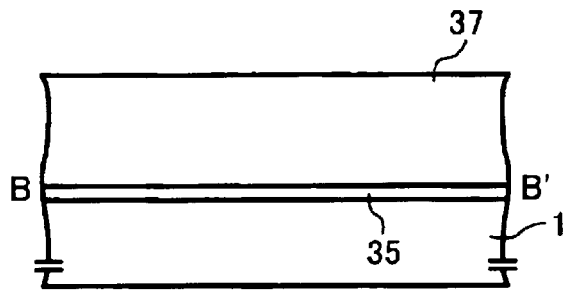
FIGS. 6A–6D are cross-sectional views for explaining an example of a first half of manufacturing processes of the embodiment shown in FIGS. 3A–3D.
Figure 6B:
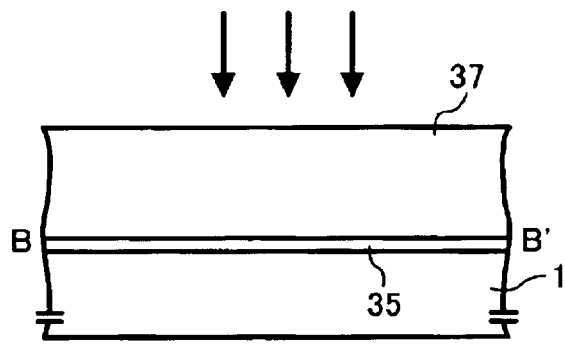
Figure 6C:
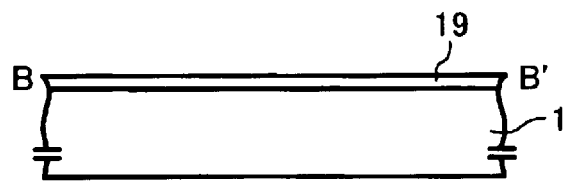
Figure 6D:
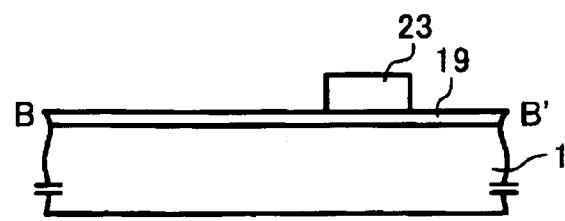

In Step 2, the resist pattern 37 is masked by ion implantation techniques to implant phosphorous in the region of the P-substrate 1 for forming the first control gate, e.g., with implant energy of 50 KeV, dose of $1 \times 10^{13}/cm^2$ (refer to FIGS. 5B and 6B).

In Step 3, the resist pattern 37 and the sacrificial oxide layer 35 are removed and then are subjected to a thermal oxidation procedure to form the memory gate oxide layer 19, e.g., having a thickness of 100 Å, and the silicon oxide layer 21 on the surface of the P-substrate 1 uncovered with the field oxide layer 3. At this time, the phosphorous implanted into the region for the first control gate in Step 2 is diffused to form the first control gate 11 including a buried N-type diffusion region (refer to FIGS. 5C and 6C).

In Step 4, a polysilicon layer, e.g., having a thickness of 3500 Å is deposited over the P-substrate 1 by chemical vapor deposition (CVD) techniques. The polysilicon layer is patterned by photolithography and etching techniques to form the floating gate 23 over the silicon oxide layer 21 on the first control gate 11, the field oxide layer 3, and the memory gate oxide layer 19 (refer to FIGS. 5D and 6D).

In Step 5, an oxide layer removing process is performed to remove the silicon oxide layer formed on the P-substrate 1 uncovered with the field oxide layer 3 and the floating gate 23. The thermal oxidation procedure is conducted to form the silicon oxide layer 25 on the upper and side surfaces of the floating gate 23. The select transistor gate oxide layer 15 including a silicon oxide layer is formed on a surface of the P-substrate 1 including the region for the select transistor gate oxide layer formation to form the silicon oxide layer 22 on the surface of the P-substrate 1 adjacent to the first control gate 11 (refer to FIGS. 5E and 6E).

In Step 6, a polysilicon layer, e.g., having a thickness of 3500 Å is deposited over the P-substrate 1 by the CVD techniques. The polysilicon layer is patterned by the photolithography techniques and etching techniques to form the second floating gate 27 over the floating gate 23 and the silicon oxide layer 22. The select gate 17 is formed on the select transistor gate oxide layer 15 (refer to FIGS. 5F and 6F).

In Step 7, a resist pattern having an opening is formed on the region for the N-type diffusion regions 5, 7, 9 and 13 formation. The resist pattern, the select gate 17 and the floating gate 23 are masked by ion implantation techniques to implant phosphorous or arsenic in the P-substrate 1, e.g., with implant energy of 70 KeV, dose of $6 \times 10^{13}/cm^2$ and to form the N-type diffusion regions 5, 7, 9 and 13 (refer to FIGS. 5G and 6G).

In Step 8, the polysilicon-metal interlayer 29, e.g., having a thickness of 8000 Å, of the silicon oxide layer is formed over the P-substrate 1 by the CVD techniques. The contact holes 31 are formed by the photolithography and etching techniques through the polysilicon-metal interlayer 29, and the silicon oxide layer 21 on the N-type diffusion region 13, and through the polysilicon-metal interlayer 29 on the second control gate 27 disposed on the silicon oxide layer 22. The conductive material 33 of aluminum is formed by e.g., a sputtering process and the etching techniques on a predetermined region inside the contact holes 31 and on the polysilicon-metal interlayer 29 (refer to FIGS. 3A–3D).

Figure 7A:
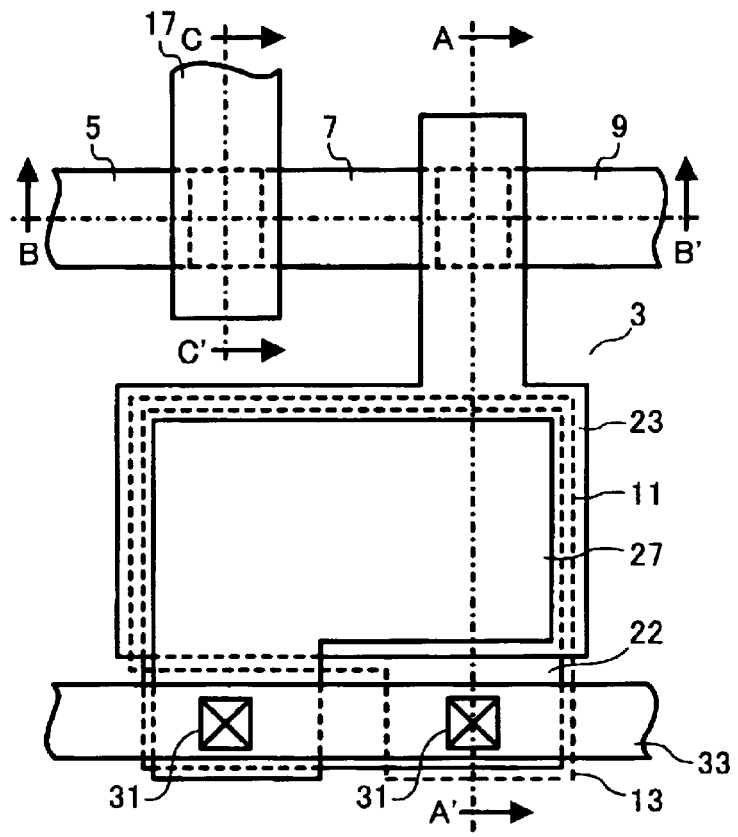
FIGS. 7A–7D are views illustrating another embodiment according to the present invention.
Figure 7B:
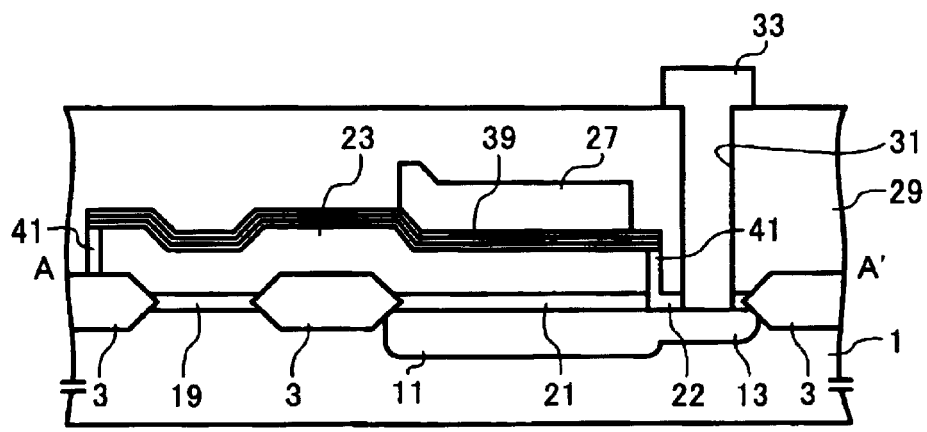
Figure 7C:
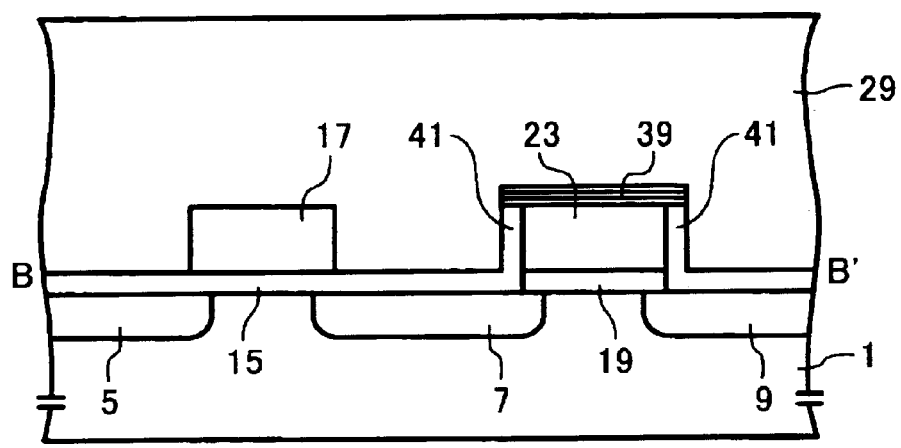
Figure 7D:
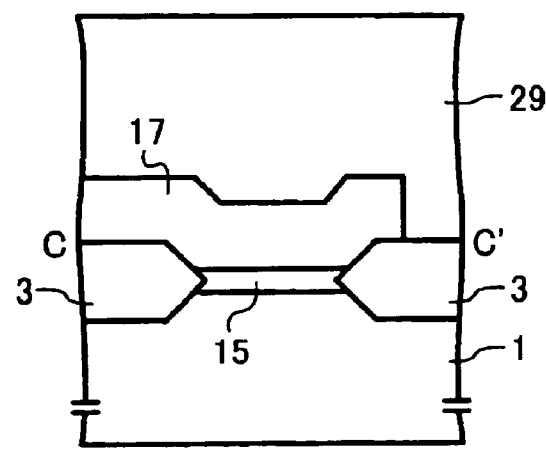

FIGS. 7A–7D illustrate another example of the semiconductor device. FIG. 7A is a plan view of a portion of the semiconductor device. FIG. 7B is a sectional view taken along line A–A' of FIG. 7A. FIG. 7C is a sectional view taken along line B–B' of FIG. 7A. FIG. 7D is a sectional view taken along line C–C' of FIG. 7A. In this embodiment, one exemplary non-volatile memory device is shown. The same reference numerals have been used to identify components which are the same functions as those in the embodiment of FIGS. 3A–3D and will be explained in no more details.

The field oxide layer 3 is formed over a surface of the P-substrate 1. The P-substrate 1 has N-type diffusion regions 5, 7, 9, and 13 and the first control gate 11 formed thereon. The select transistor gate oxide layer 15 is formed over the surface of the P-substrate 1 including the region between the N-type diffusion regions 5 and 7. The select gate 17 is formed on the select transistor gate oxide layer 15. The silicon oxide layer 21 is formed on the first control gate 11, followed by formation of the silicon oxide layer 22 on the N-type diffusion region 13.

The gate oxide layer 19 for memory is formed over the surface of the P-substrate 1 including the region between the N-type diffusion regions 7 and 9. The floating gate 23 of a polysilicon layer is formed over the silicon oxide layer 21, the field oxide layer 3, and the memory gate oxide layer 19.

The floating gate 23 has a multilayer film 39 (not shown in FIG. 7A) of a silicon oxide layer, a silicon nitride layer, a silicon oxide layer formed thereon sequentially from bottom to top. An allowable thickness range of the lower silicon oxide layer of the multilayer film 39 is between about 100 and about 350 Å. In this embodiment, the lower silicon oxide layer has a thickness of about 150 Å, for example. An allowable thickness range of the silicon nitride layer of the multilayer film 39 is between about 100 and about 200 Å. In this embodiment, the silicon nitride layer has a thickness of about 150 Å, for example. An allowable thickness range of the upper silicon oxide layer of the multilayer film 39 is between about 5 and about 50 Å. In this embodiment, the upper silicon oxide layer has a thickness of about 15 Å, for example. The multilayer film 39 includes a third insulating layer of a semiconductor device of the present invention.

A polysilicon side oxide layer (i.e., silicon oxide layer) 41 of the silicon oxide layer is formed on the side surface of the floating gate 23. An allowable thickness range of the polysilicon side oxide layer 41 is between about 100 and about 350 Å. In this embodiment, the polysilicon side oxide layer 41 has a thickness of about 250 Å, for example. The polysilicon side oxide layer 41 includes a fourth insulating layer of the semiconductor device of the present invention.

The second control gate 27 of a polysilicon layer is formed over the multilayer film 39 on the floating gate 23 and over the silicon oxide layer 22. A portion of a side of the floating gate 23 is disposed under a portion of the second control gate 27 with the polysilicon side oxide layer 41 therebetween.

A polysilicon-metal interlayer 29 is formed over the P-substrate 1, the upper portion of the field oxide layer 3, the N-type diffusion regions 5, 7, 9 and 13, the first control gate 11, the select gate 17, the floating gate 23 and the second control gate 27.

The contact holes 31 are formed through the polysilicon-metal interlayer 29, and the silicon oxide layer 21 on the N-type diffusion region 13, and through the polysilicon-metal interlayer 29 on the second control gate 27 disposed on the silicon oxide layer 22. The conductive material 33 is formed inside the contact hole 31 and on a predetermined region within the polysilicon-metal interlayer 29.

In this embodiment, the multilayer film 39 is provided including an electron-opaque silicon nitride layer between the first control gate 11 and the floating gate 23, thereby improving memory reliability.

The multilayer film 39 of a silicon oxide layer, a silicon nitride layer, a silicon oxide layer are disposed on the upper surface of the floating gate 23. The silicon side oxide layer 41 is provided on the side surface of the floating gate 23. In this structure, the lower silicon oxide layer and the silicon nitride layer for the multilayer film 39 are formed on the upper surface of floating gate 23. Thereafter, the silicon side oxide layer 41 on the side surface of the floating gate 23 and the upper silicon oxide layer for the multilayer film 39 are simultaneously formed to prevent the upper floating gate 23 from becoming oxidized by the silicon nitride layer. It also prevents a significant thickness of the multilayer film 39, thus enhancing thickness control of the multilayer film 39.

In the embodiment shown in FIGS. 7A–7D, the select gate 17 may be formed at the same time or not at the same time the second control gate 27 or the floating gate 23 is formed. One exemplary manufacturing process for forming the select gate 17 simultaneously with the second control gate 27 will be now described.

Referring to FIGS. 7A–7D to 9A–9D, the manufacturing process will be described. FIGS. 8A–8D and 9A–9D are cross-sectional views for explaining an exemplary manufacturing process of the embodiment shown in FIGS. 7A–7D. FIGS. 8A–8D are sections taken along line A–A' of FIG. 9A. FIGS. 9A–9D are sections taken along line B–B' of FIG. 9A.

Figure 8A:
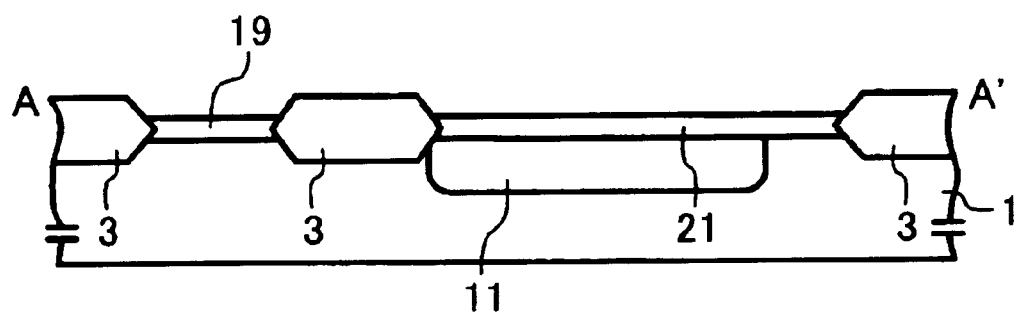
FIGS. 8A–8D are cross-sectional views for explaining an example of manufacturing processes of the embodiment shown in FIGS. 7A–7D.
Figure 8B:
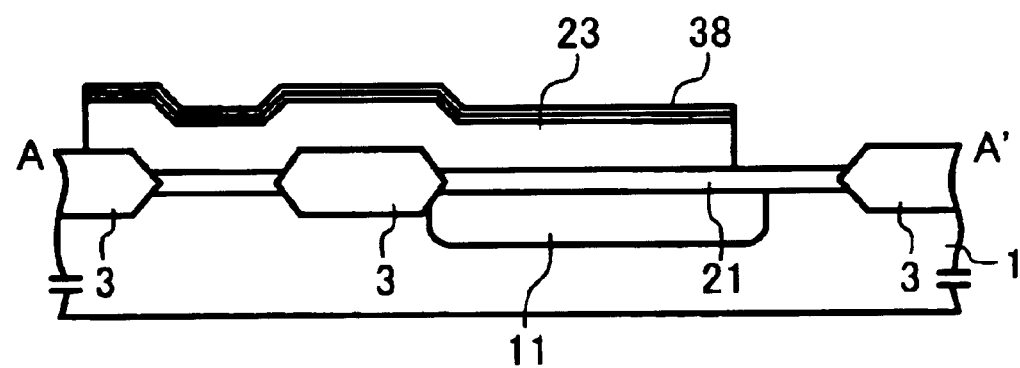
Figure 8C:
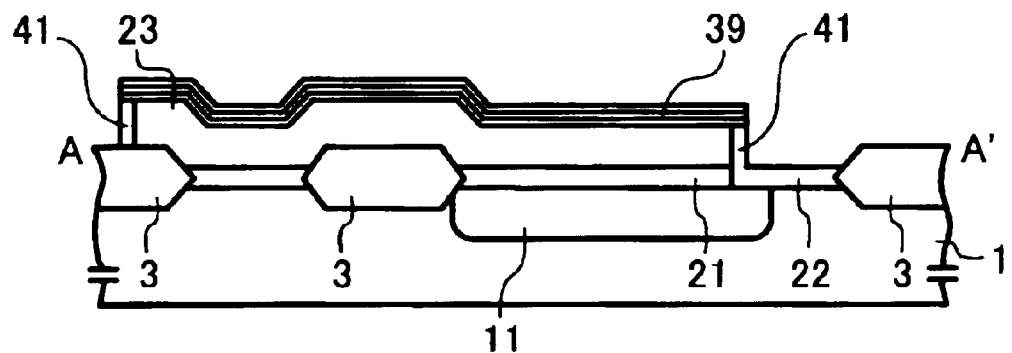
Figure 8D:
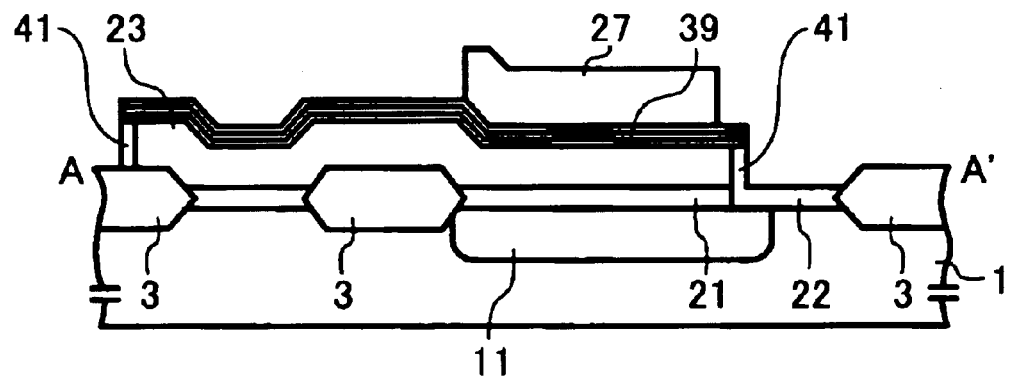
Figure 9A:
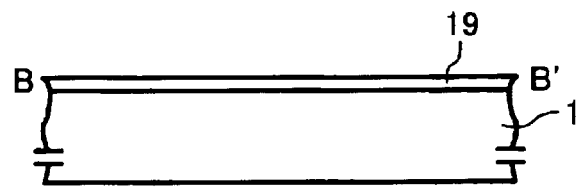
FIGS. 9A–9D are cross-sectional views for explaining an example of manufacturing processes of the embodiment shown in FIGS. 7A–7D.
Figure 9B:
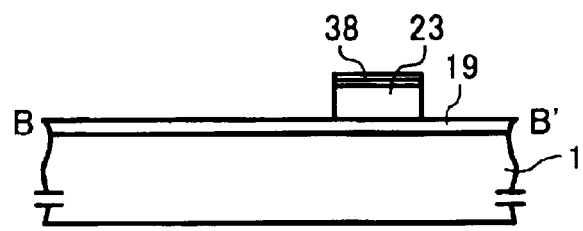
Figure 9C:
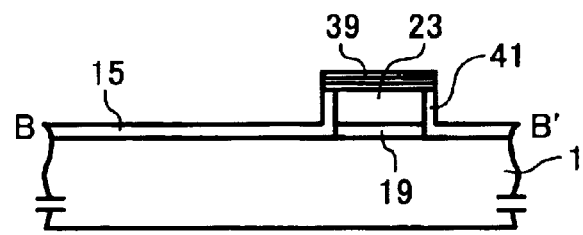
Figure 9D:
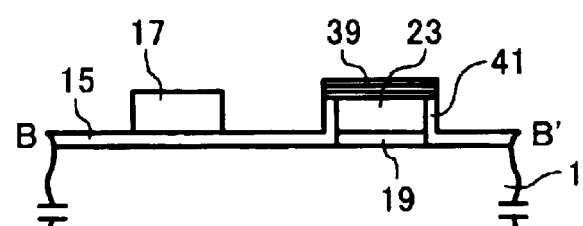

In Step 1, in a similar manner to the above-mentioned Steps 1 to 4 described with reference to FIGS. 5A–5D and FIGS. 6A–6D, the field oxide layer 3, the N-type diffusion regions 5, 7, 9 and 13, the first control gate 11 and the gate oxide layer 19 for memory are formed on the P-substrate 1 (refer to FIGS. 8A and 9A).

In Step 2, the P-substrate 1 has disposed thereon the polysilicon layer, which in turn has disposed thereon a multilayer film 38 of the silicon oxide layer and the silicon nitride layer, both e.g., having a thickness of 150 Å. The multilayer film 38 and the polysilicon layer are patterned by the photolithography and etching techniques to form the floating gate 23, which has formed thereon the multilayer film 38 (refer to FIGS. 8B and 9B).

In Step 3, the oxide layer removing process is performed to remove the silicon oxide layer formed on the P-substrate 1 uncovered with the field oxide layer 3 and the floating gate 23. The thermal oxidation procedure is conducted to form the polysilicon side oxide layer 41, e.g., having a thickness of about 250 Å on the side surface of the floating gate 23. At this time, a re-oxidation of the silicon nitride layer including the multilayer film 38 forms the silicon oxide layer, e.g., having a thickness of about 15 Å over the surface of the silicon nitride layer, thereby forming a multilayer film 39 including three layers of a silicon oxide layer, a silicon nitride layer, a silicon oxide layer.

The resulting multilayer film 39 prevents the upper floating gate 23 from becoming oxidized by the silicon nitride layer including the multilayer film 38. It also prevents a significant thickness of the multilayer film 39, thus enhancing thickness control of the multilayer film 39. In addition, the select transistor gate oxide layer 15 including the silicon oxide layer is formed on a surface of the P-substrate 1 including the region for the select transistor gate oxide layer formation to form the silicon oxide layer 22 on the surface of the P-substrate 1 adjacent to the first control gate 11 (see FIGS. 8C and 9C).

Figure 5E:
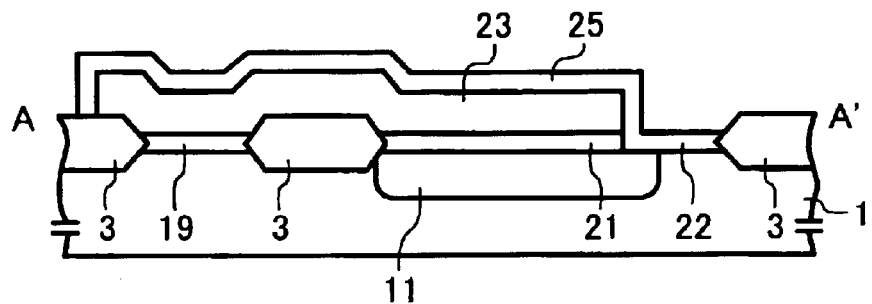
FIGS. 5E–5G are cross-sectional views for explaining an example of a second half of manufacturing processes of the embodiment shown in FIGS. 3A–3D.
Figure 5F:
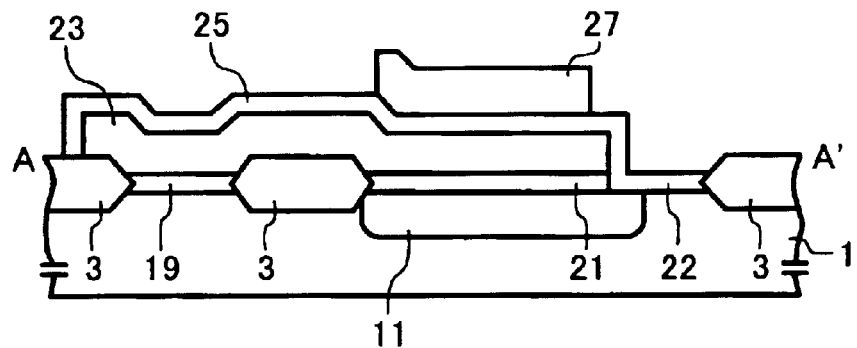
Figure 6E:
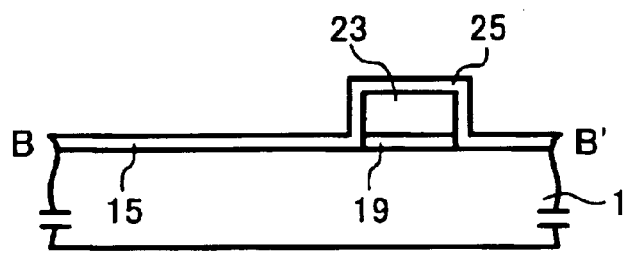
FIGS. 6E–6G are cross-sectional views for explaining examples of a second half of manufacturing processes of the embodiment shown in FIGS. 3A–3D.
Figure 6F:
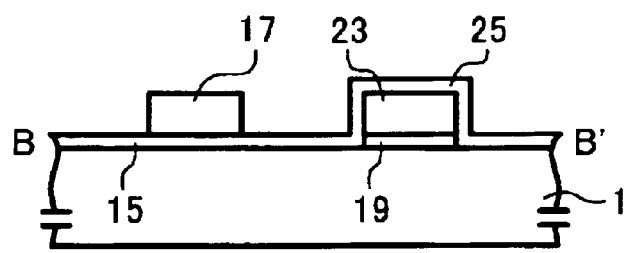

In Step 4, in a similar manner to the above-mentioned Step 6 described with reference to FIGS. 5F and 6F, the second floating gate 27 is formed over the floating gate 23 and the silicon oxide layer 22. The select transistor 17 is formed on the select transistor gate oxide layer 15 (refer to FIGS. 8D and 9D).

Figure 5G:
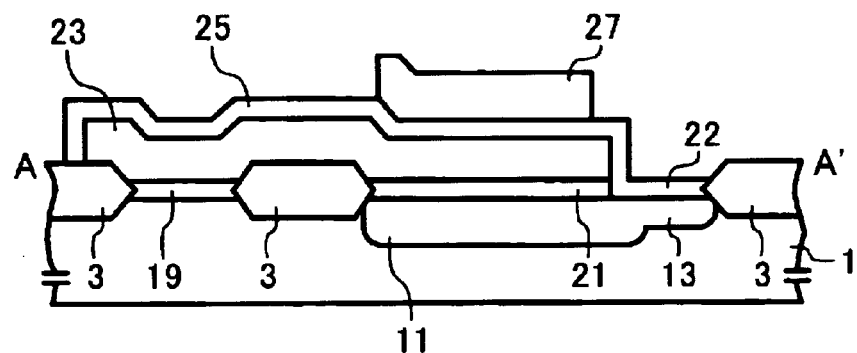
Figure 6G:
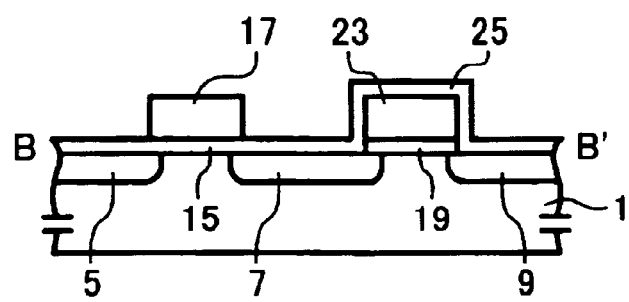

In Step 5, in a similar manner to the above-mentioned Step 7 described with reference to FIGS. 5G and 6G, the N-type diffusion regions 5, 7, 9 and 13 are formed. In a similar manner to the above-mentioned Step 8 described with reference to FIGS. 3A–3D, the polysilicon-metal interlayer 29, the contact holes 31, and the conductive material 33 are formed on the P-substrate 1 (refer to FIGS. 7A–7D).

Figure 10A:
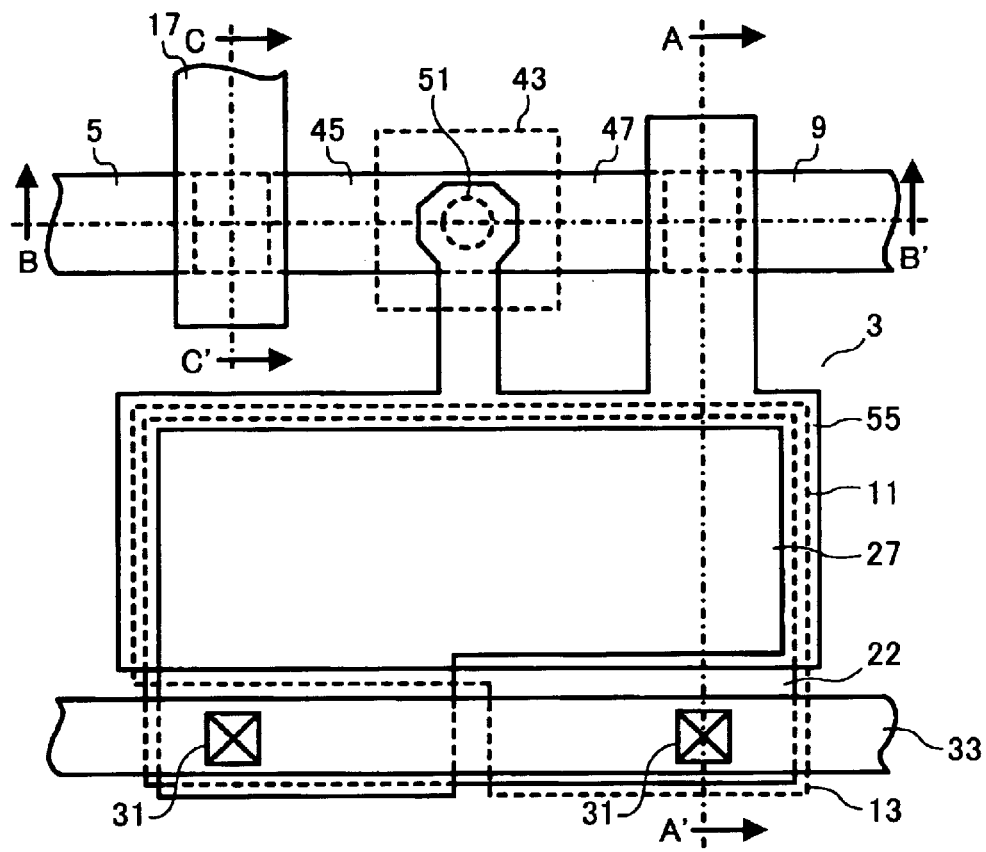
FIGS. 10A–10D are views illustrating another embodiment according to the present invention.
Figure 10B:
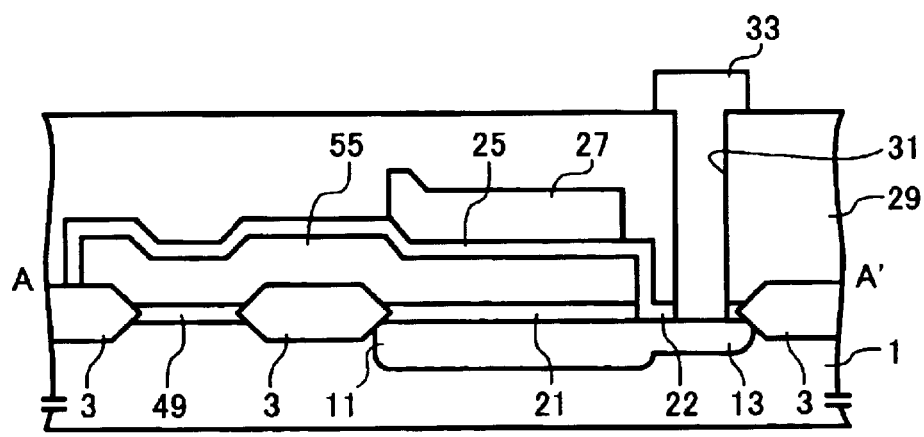
Figure 10C:
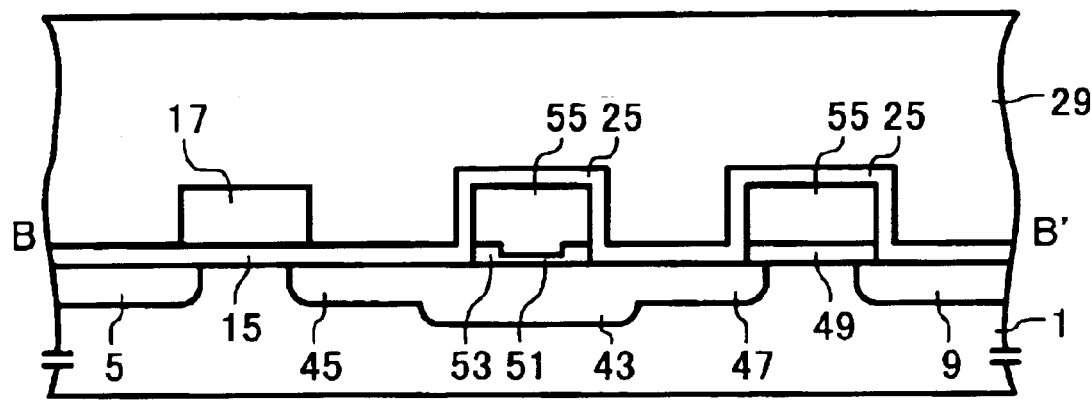
Figure 10D:
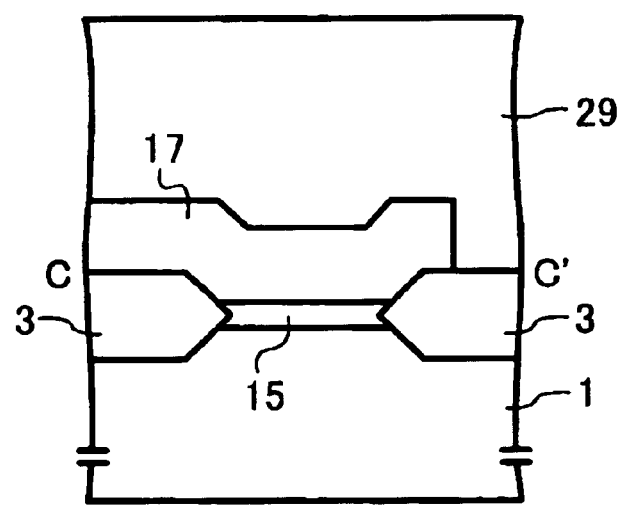
Figure 11A:
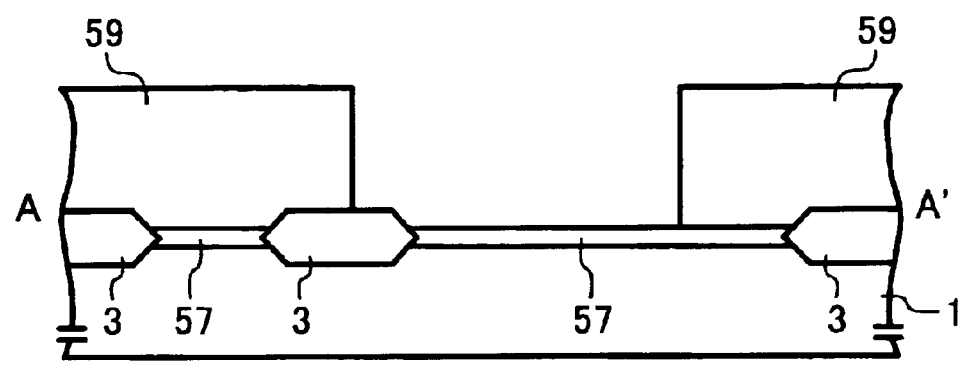
FIGS. 11A–11E are cross-sectional views for explaining an example of a first half of manufacturing processes of the embodiment shown in FIGS. 10A–10D.
Figure 11B:
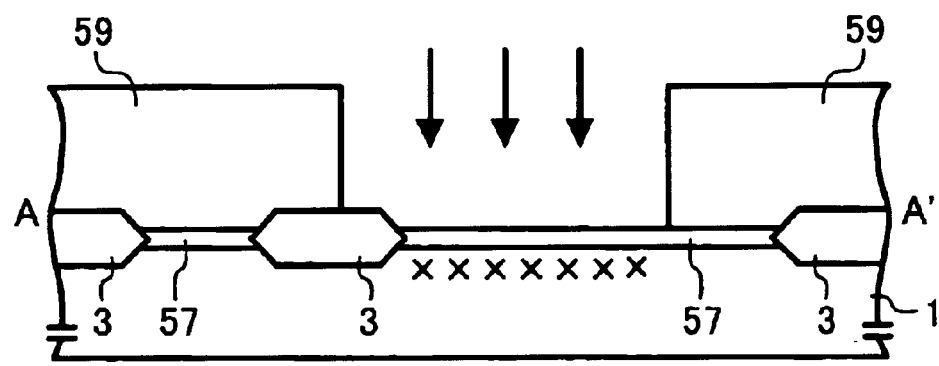
Figure 11C:
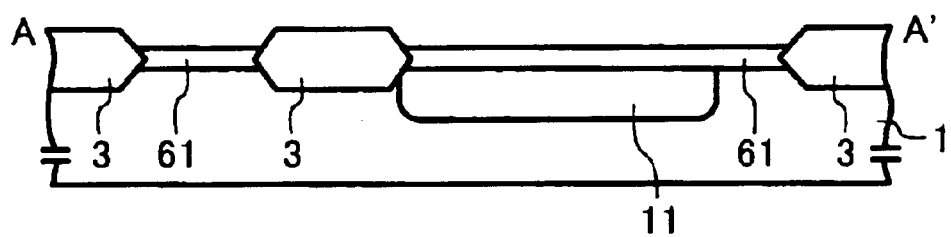
Figure 11D:
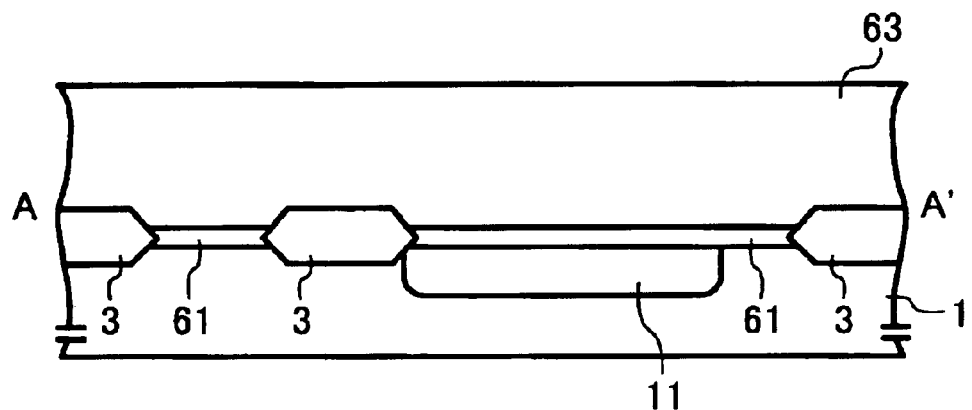
Figure 11E:
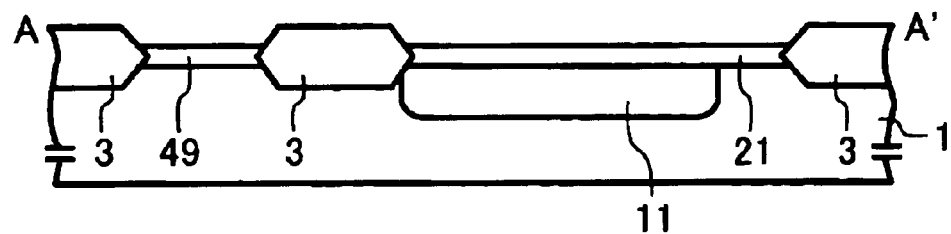
Figure 11F:
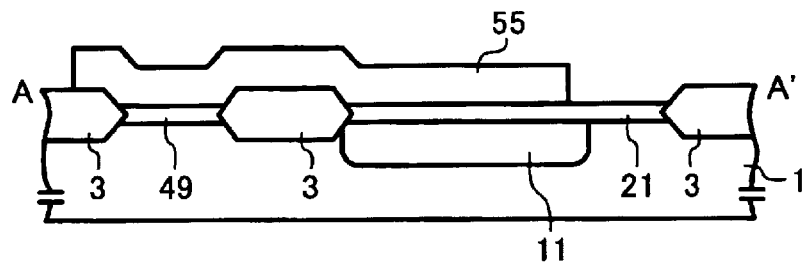
FIGS. 11F–11I are cross-sectional views for explaining an example of a second half of manufacturing processes of the embodiment shown in FIGS. 10A–10D.
Figure 11G:
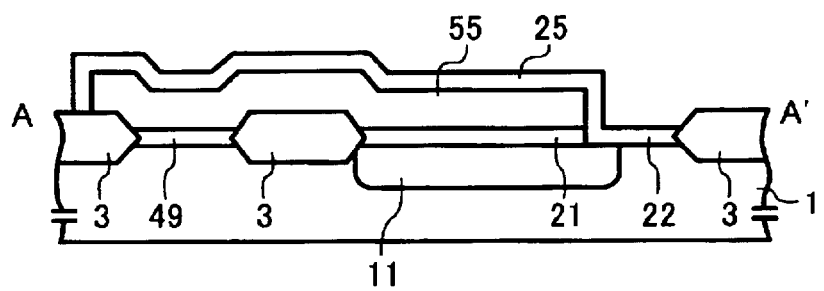
Figure 11H:
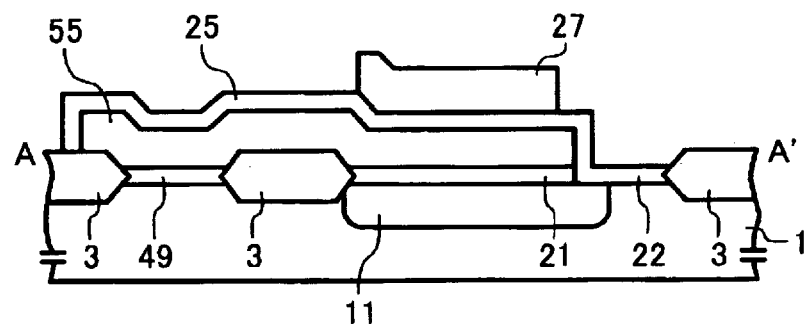
Figure 11I:
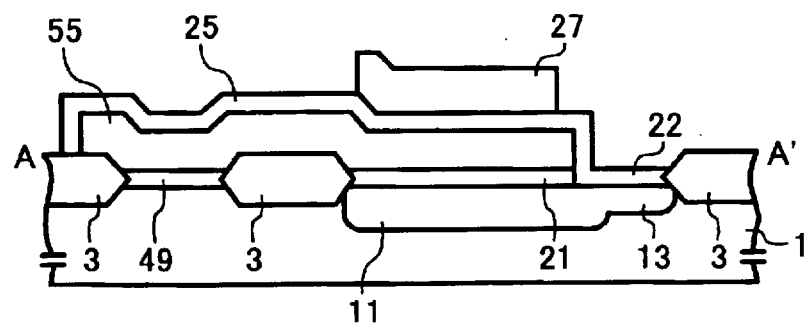
Figure 12A:
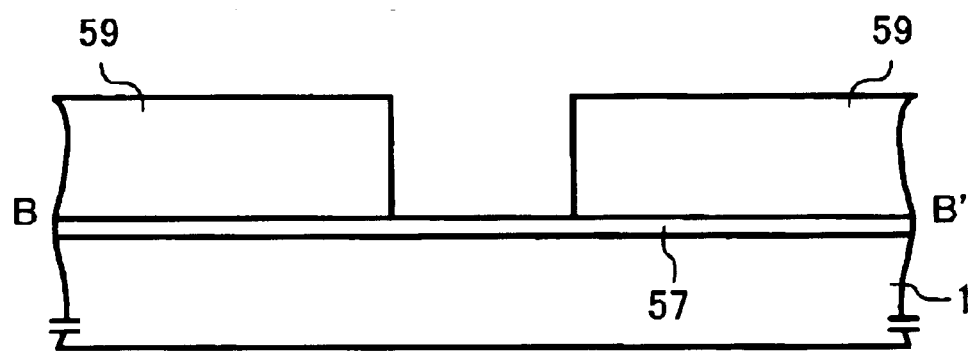
FIGS. 12A–12E are cross-sectional views for explaining an example of a first half of manufacturing processes of the embodiment shown in FIGS. 10A–10D.
Figure 12B:
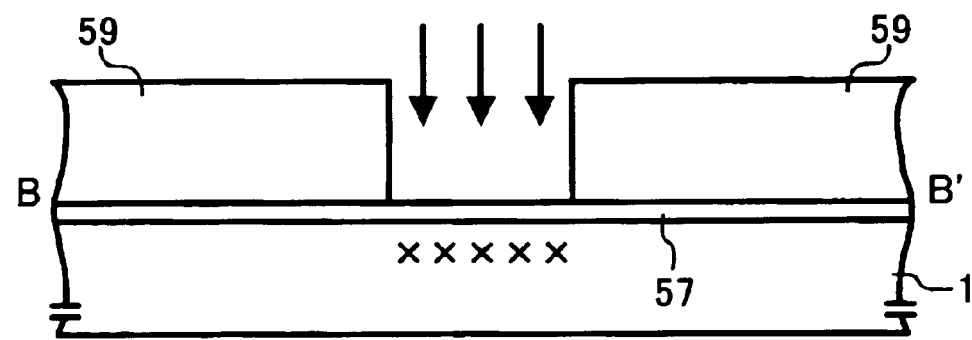
Figure 12C:
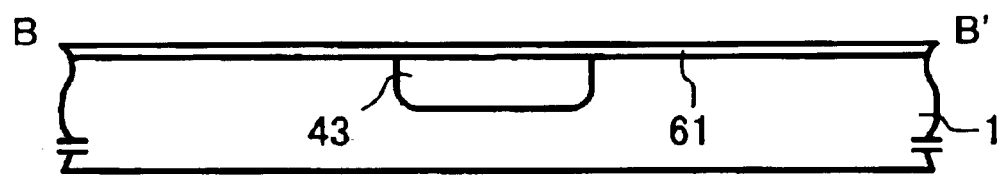
Figure 12D:
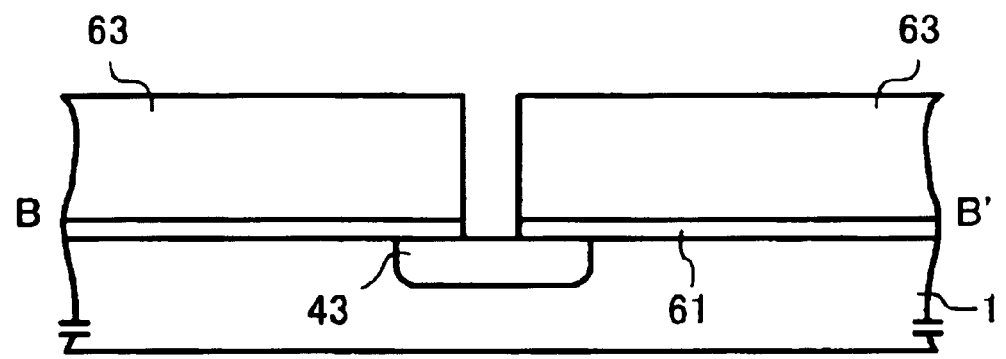
Figure 12E:
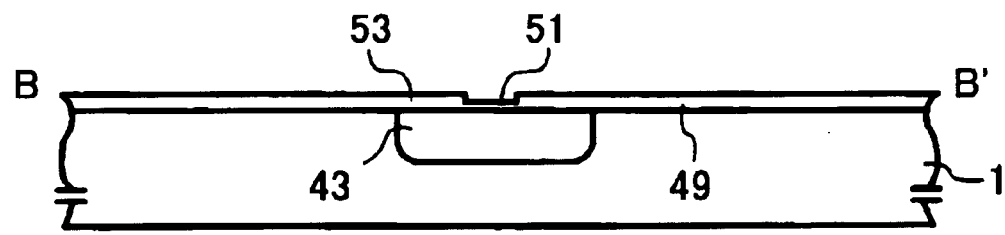
Figure 12F:
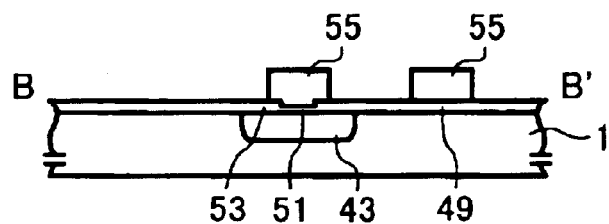
FIGS. 12F–12I are cross-sectional views for explaining an example of a second half of manufacturing processes of the embodiment shown in FIGS. 10A–10D.
Figure 12G:
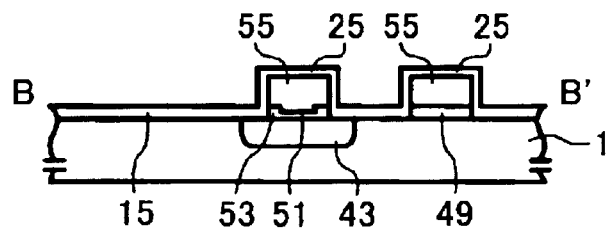
Figure 12H:
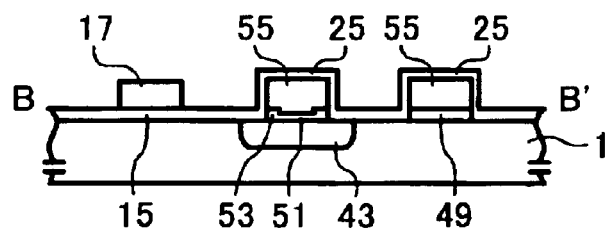
Figure 12I:
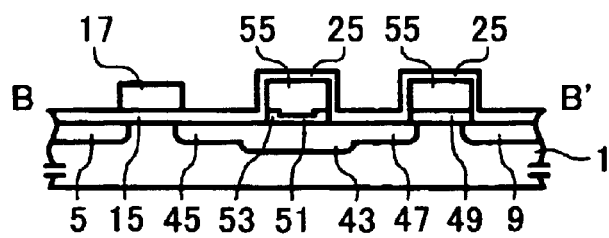

FIGS. 10A–10D illustrate another example of the semiconductor device. FIG. 10A is a plan view of a portion of the semiconductor device. FIG. 10B is a sectional view taken along line A–A' of FIG. 10A. FIG. 12C is a sectional view taken along line B–B' of FIG. 10A. FIG. 10D is a sectional view taken along line C–C' of FIG. 10A. In this embodiment, one exemplary non-volatile memory device is shown. The same reference numerals have been used to identify components which are the same functions as those in the embodiment of FIGS. 3A–3D and will be explained in no more details.

The field oxide layer 3 is formed over a surface of the P-substrate 1. A buried N-type diffusion layer 43 is formed on a portion of the P-substrate 1 uncovered with the field oxide layer 3. N-type diffusion regions 45 and 47 electrically connected to the buried diffusion layer 43 are formed on each side of the buried diffusion layer 43. The P-substrate 1 has the N-type diffusion region 5, the N-type diffusion region 9, the N-type diffusion region 13 and the first control gate 11 formed thereon. The N-type diffusion region 5 is spaced with the N-type diffusion region 45. The N-type diffusion region 9 is spaced with the N-type diffusion region 47. The N-type diffusion region 13 and the first control gate 11 are electrically isolated from N-type diffusion regions 5, 9, 43, 45 and 47.

A gate oxide layer 49 for memory is formed on the surface of the P-substrate 1 and portions of the surface of the N-type diffusion regions 9 and 47. An allowable thickness range of the gate oxide layer 49 is between about 200 and about 600 Å. In this embodiment, the gate oxide layer 49 has a thickness of about 400 Å, for example.

A tunneling oxide layer 51 is formed on a portion of a surface of the buried diffusion layer 43. An allowable thickness range of the tunneling oxide layer 51 is between about 80 and about 100 Å. In this embodiment, the tunneling oxide layer 51 has a thickness of about 90 Å, for example. The tunneling oxide layer 51 provides a passageway for electric charge at the time of a memory writing and erasing. A silicon oxide layer 53 is formed on the surface of the buried diffusion layer 43 around the tunneling oxide layer 51. An allowable thickness range of the silicon oxide layer 53 is between about 200 and about 600 Å. In this embodiment, the silicon oxide layer 53 has a thickness of about 400 Å, for example.

A select transistor gate oxide layer 15 is formed on the surface of the P-substrate 1 including the region between the N-type diffusion regions 5 and 45. The select transistor 17 is formed on the select transistor gate oxide layer 15. The silicon oxide layer 21 is formed on the first control gate 11. The silicon oxide layer 22 is formed on the N-type diffusion region 13.

A polysilicon floating gate 55 is formed over the silicon oxide layer 21, the field oxide layer 3, and the memory gate oxide layer 49. An allowable thickness range of the polysilicon floating gate 55 is between about 2500 and about 4500 Å. In this embodiment, the polysilicon floating gate 55 has a thickness of about 3500 Å, for example. A portion of the floating gate 55 is also disposed on the tunneling oxide layer 51 and the silicon oxide layer 53. The silicon oxide layer 25 (not shown in FIG. 10A) is formed on the surface of the floating gate 55. The second control gate 27 is formed over the silicon oxide layer 25 on the floating gate 55 and the silicon oxide layer 22.

The polysilicon-metal interlayer 29 is formed over the P-substrate 1, the upper portion of the field oxide layer 3, the N-type diffusion regions 5, 9, 13, 45 and 47, the first control gate 11, the select gate 17, the floating gate 55 and the second control gate 27.

The contact holes 31 are formed through the polysilicon-metal interlayer 29, and the silicon oxide layer 21 on the N-type diffusion region 13, and through the polysilicon-metal interlayer 29 on the second control gate 27 disposed on the silicon oxide layer 22. The conductive material 33 is formed inside the contact hole 31 and on a predetermined region within the polysilicon-metal interlayer 29.

In this embodiment, the tunneling oxide layer 51 having a thickness less than the memory gate oxide layer 49 is provided to reduce etching damage at the time of polysilicon layer etching as compared to the case where both edge portion and diffusion/wraparound portions of the floating gate 23 are formed as tunneling regions. As a result, reliability such as charge retention characteristics is advantageously increased.

In the embodiment shown in FIGS. 10A–10D, the select gate 17 may be formed at the same time or not at the same time the second control gate 27 or the floating gate 55 is formed. One exemplary manufacturing process for forming the select gate 17 simultaneously with the second control gate 27 will be now described.

Referring to FIGS. 10A–10D to FIGS. 12A–12I, the manufacturing process will be described. FIGS. 11A–11E to 12A–12I are cross-sectional views for explaining an exemplary manufacturing process of the embodiment shown in FIGS. 10A–10D. FIGS. 11A–11I are sections taken along line A–A' of FIG. 10A. FIGS. 12A–12I are sections taken along line B–B' of FIG. 10A.

In Step 1, the field oxide layer 3 is formed on the P-substrate 1 by the normal LOCOS method to separate element from the P-substrate 1. A sacrificial oxide layer 57 having a thickness of, for example, 250 to 400 Å is formed on a surface of the P-substrate 1 uncovered with the field oxide layer 3. A resist pattern 59 having an opening of region for the first control gate formation and the buried diffusion layer formation is formed by the photolithography techniques (refer to FIGS. 11A and 12A).

In Step 2, the resist pattern 59 is masked by the ion implantation techniques to implant phosphorous in regions in which the first control gate and the buried diffusion layer of the P-substrate 1 are formed, e.g., with implant energy of 50 KeV, dose of $1 \times 10^{13}/cm^2$. (refer to FIGS. 11B and 12B).

In Step 3, after removal of the resist pattern 59 and the sacrificial oxide layer 57, the thermal oxidation procedure is conducted to form a silicon oxide layer 61 having a thickness of, e.g., 350 Å on the surface of the P-substrate 1 uncovered with the field oxide layer 3. At this time, the phosphorous implanted into the region in which the first control gate formation and the buried diffusion layer are formed in Step 2 is diffused to form the first control gate 11 and the buried diffusion region 43 including the buried N-type diffusion region (refer to FIGS. 11C and 12C).

In Step 4, a resist pattern 63 having an opening corresponding to the region in which the tunneling oxide layer is formed, is formed. The resist pattern 63 is masked to selectively remove the silicon oxide layer 61 on the region in which the tunneling oxide layer is formed (refer to FIGS. 11D and 12D).

In Step 5, subsequent to removing the resist pattern 63, the thermal oxidation procedure is conducted to form the tunneling oxide layer 51, e.g., having a thickness of 90 Å over the surface of the P-substrate 1 in the region in which the tunnel oxide layer is formed. At this time, tunnel oxide layer peripheral regions and other regions of the silicon oxide layer 61 are grown to, e.g., a thickness of 400 Å to form silicon oxide layers 21 and 53 and the memory gate oxide layer 49 (refer to FIGS. 11E and 12E).

A polysilicon layer having a thickness of, e.g., 3500 Å is deposited over the P-substrate 1 by the CVD techniques. The polysilicon layer is patterned by the photolithography and etching techniques to form the floating gate 55 over the silicon oxide layer 21 on the first control gate 11, the field oxide layer 3, the memory gate oxide layer 49, the tunnel oxide layer 51, and the silicon oxide layer 53 (refer to FIGS. 11F and 12F).

In Step 6, the oxide layer removing process is performed to remove a silicon oxide layer formed on the P-substrate 1 uncovered with the field oxide layer 3 and the floating gate 55. The thermal oxidation procedure is conducted to form the silicon oxide layer 25 on the surface of the floating gate 55. The select transistor gate oxide layer 15 including a silicon oxide layer is formed on a surface of the P-substrate 1 including the region for the select transistor gate oxide layer formation to form the silicon oxide layer 22 on the surface of the P-substrate 1 adjacent to the first control gate 11 (refer to FIGS. 11G and 12G).

In Step 7, the polysilicon layer having a thickness of, e.g., 3500 Å is deposited over the P-substrate 1 by the CVD techniques. The polysilicon layer is patterned by the photolithography and etching techniques to form the second floating gate 27 in the regions over the floating gate 55 and the silicon oxide layer 22. The select gate 17 is formed on the select transistor gate oxide layer 15 (refer to FIGS. 11H and 12H).

In Step 8, a resist pattern having an opening is formed on the region in which the N-type diffusion regions 5, 9, 13, 45 and 47 are formed. The resist pattern, the select gate 17 and the floating gate 55 are masked by the ion implantation techniques to implant phosphorous or arsenic in the P-substrate, e.g., with implant energy of 70 KeV, dose of $6\times10^{13}/cm^{2}$ and to form the N-type diffusion regions 5, 9, 13, 45 and 47 (refer to FIGS. 11I and 12I).

In Step 9, in a similar manner to the above-mentioned Step 8 described with reference to FIGS. 3A–3D, the polysilicon-metal interlayer 29, the contact holes 31, and the conductive material 33 are formed on the P-substrate 1 (refer to FIGS. 10A–10D).

In this manufacturing process, the silicon oxide layer 25 is formed on the surface of the floating gate 55. However, in a similar manner to the manufacturing process described with reference to FIGS. 7A–7D to 9A–9D, the multilayer film of a silicon oxide layer, a silicon nitride layer, a silicon oxide layer may be disposed on the upper surface of floating gate 55 to form the silicon layer on the side surface of floating gate 55. In this case, the insulting layer formed on the upper and side surfaces of the floating gate 55 can have different types and thicknesses, thereby providing flexibility in a high coupling ratio and improving process selectivity.

Referring to the above-mentioned three manufacturing processes, in the Step 5 described with reference to FIGS. 5E and 6E, the select transistor gate oxide layer 15 is formed at the same time the silicon oxide layer 25 is formed on the surface of the floating gate 23. In the Step 3 described with reference to FIGS. 8C and 9C, the select transistor gate oxide layer 15 is formed at the same time the silicon side oxide layer 41 is formed on the side surface of the floating gate 23. In the Step 8 described with reference to FIGS. 11H and 12H, the select transistor gate oxide layer 15 is formed at the same time the silicon oxide layer 25 is formed on the surface of the floating gate 23.

However, when the select transistor gate oxide layer 15 is substantially different from the silicon oxide layer 25 or the silicon side oxide layer 41 in desired thickness, they requires separate formation. In this case, for example, the silicon oxide layer 25 or the silicon side oxide layer 41 is formed and then the silicon oxide layer of the region in which the select transistor gate oxide layer is formed, is removed by the photolithography and etching techniques, followed by oxidation. As a result, the select transistor gate oxide layer 15 and-the silicon oxide layer 25 or the silicon side oxide layer 41 obtain a desired thickness respectively.

Figure 13A:
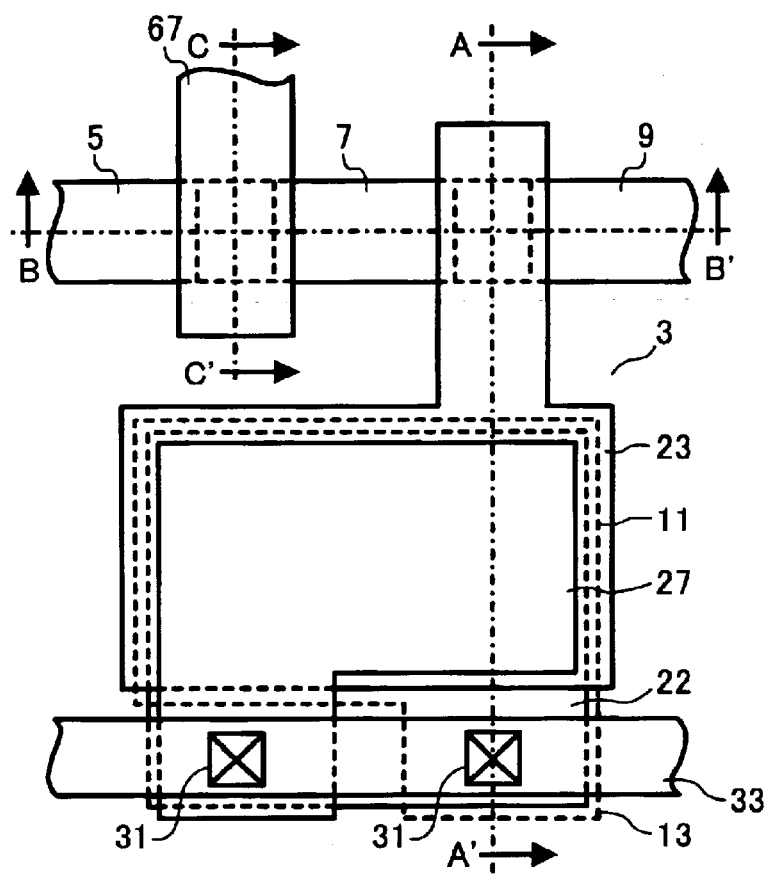
FIGS. 13A–13D are views illustrating another embodiment according to the present invention.
Figure 13B:
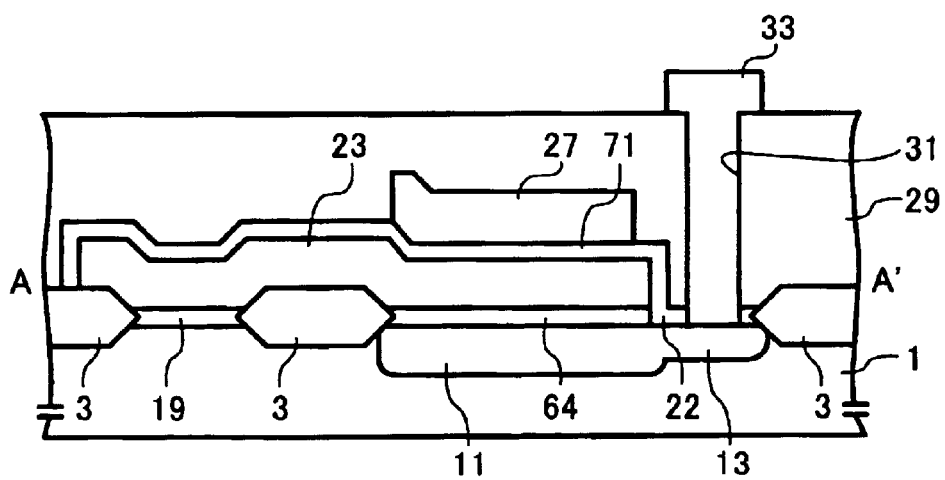
Figure 13C:
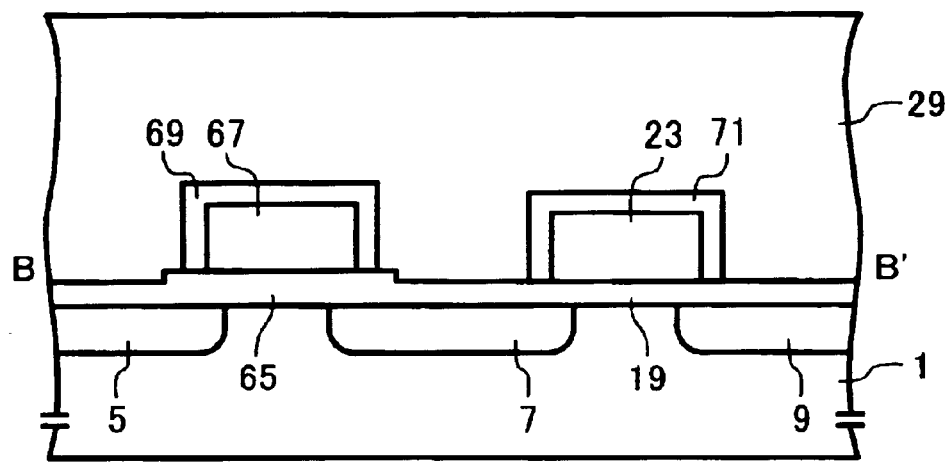
Figure 13D:
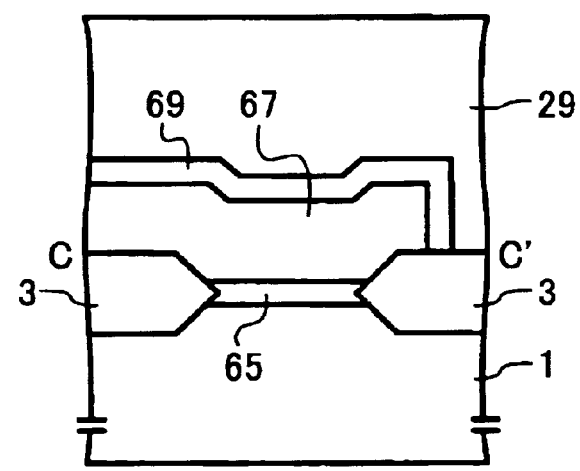
Figure 14A:
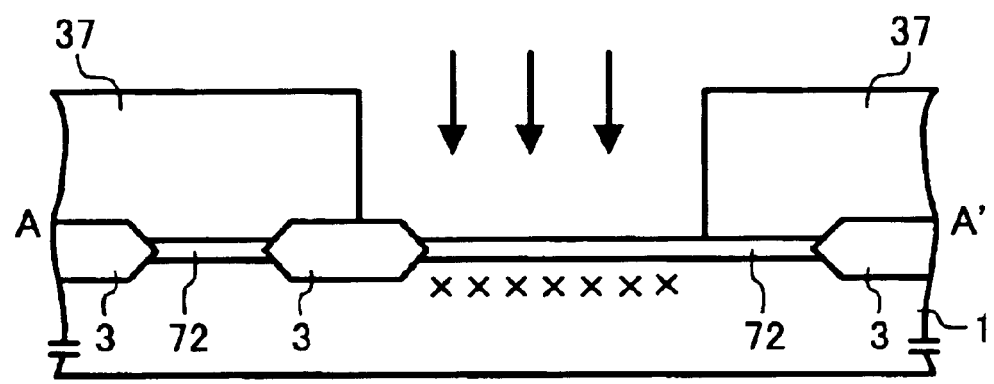
FIGS. 14A–14E are cross-sectional views for explaining examples of manufacturing processes of the embodiment shown in FIGS. 13A–13D.
Figure 14B:
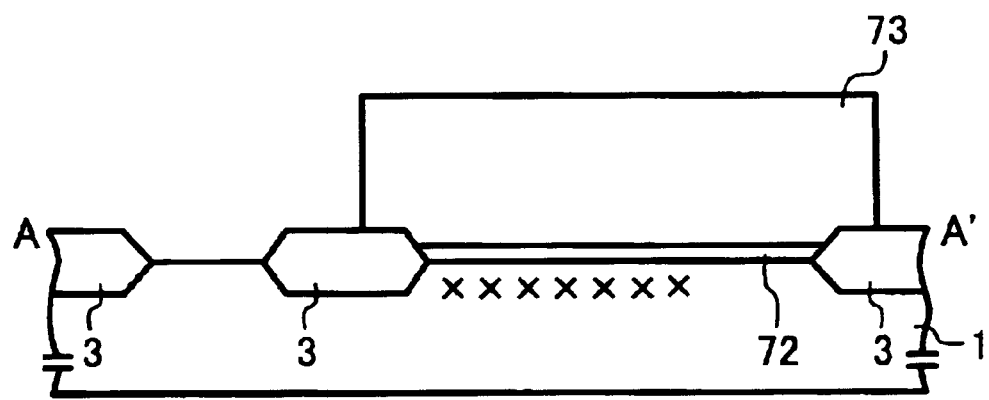
Figure 14C:
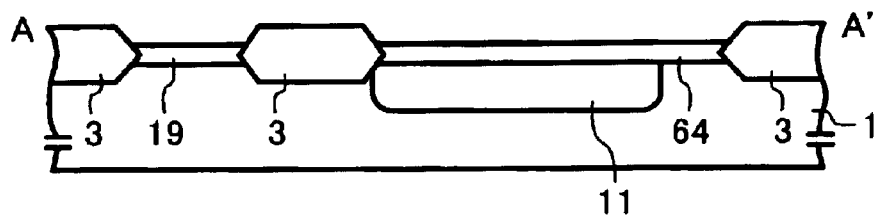
Figure 14D:
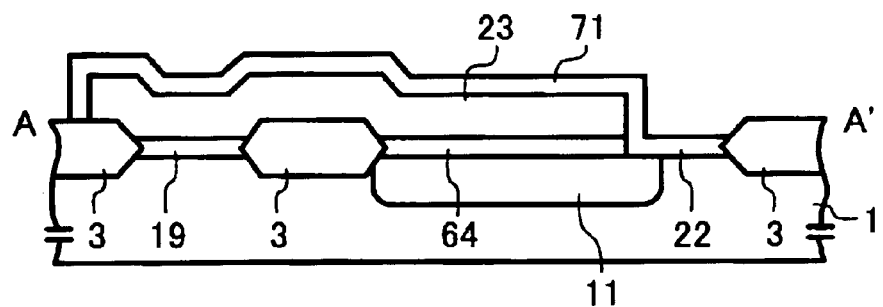
Figure 14E:
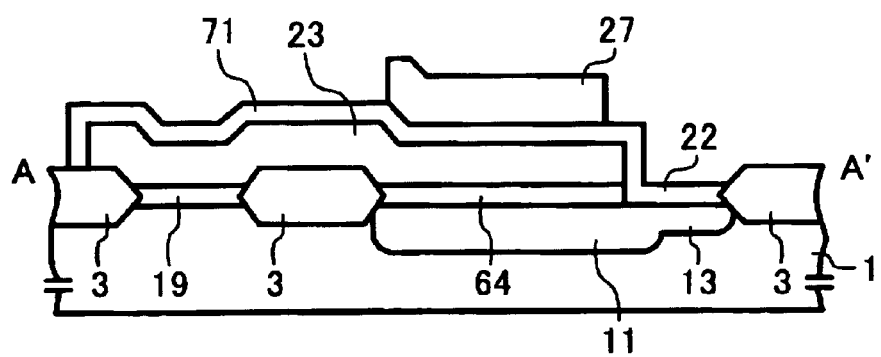
Figure 15A:
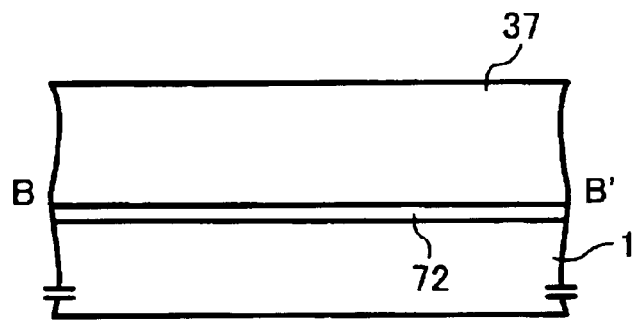
FIGS. 15A–15E are cross-sectional views for explaining an example of manufacturing processes of the embodiment shown in FIGS. 13A–13D.
Figure 15B:
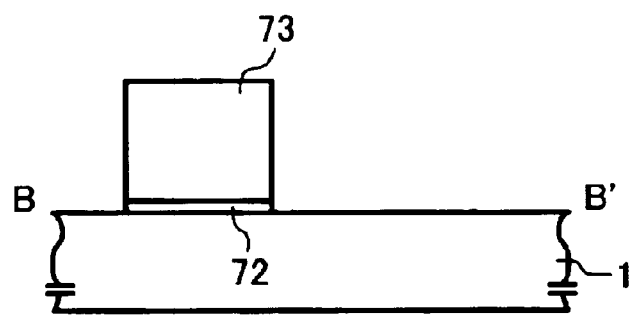
Figure 15C:
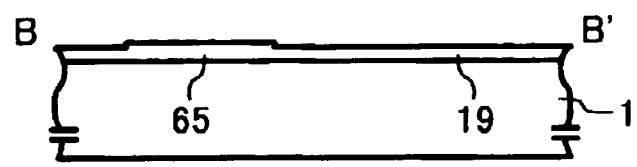
Figure 15D:
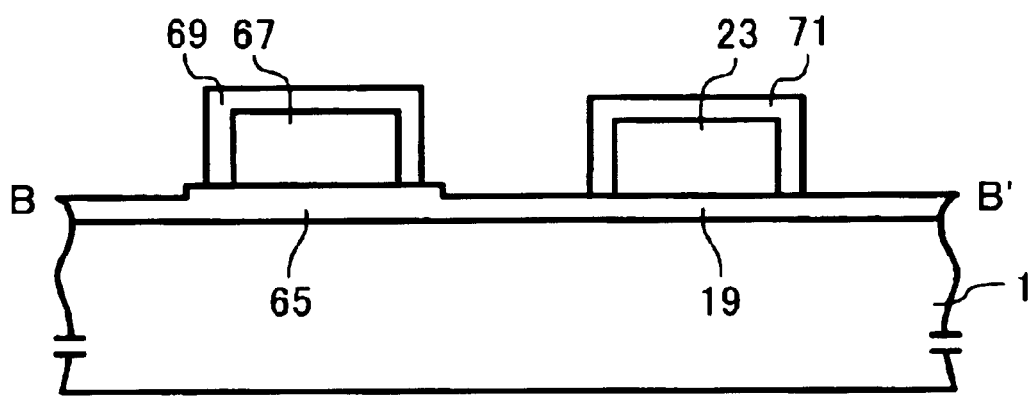
Figure 15E:
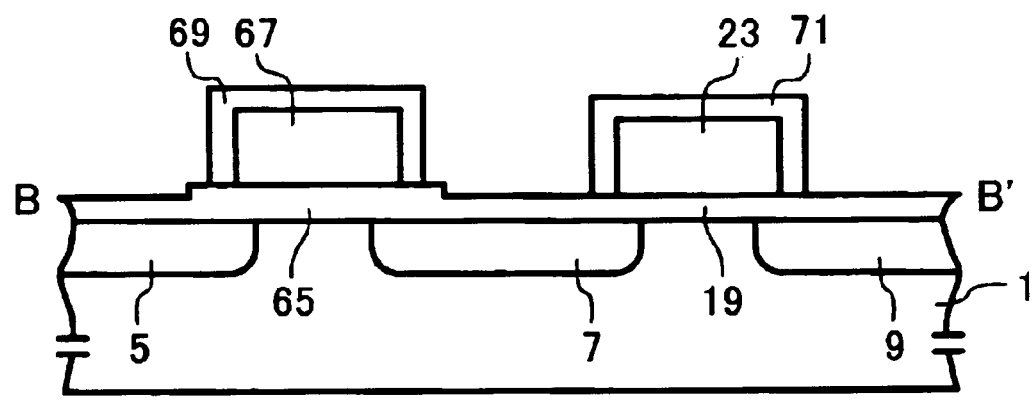

FIGS. 13A–13D illustrate another example of the semiconductor device. FIG. 13A is a plan view of a portion of the semiconductor device. FIG. 13B is a sectional view taken along line A–A' of FIG. 13A. FIG. 13C is a sectional view taken along line B–B' of FIG. 13A. FIG. 13D is a sectional view taken along line C–C' of FIG. 13A. In this embodiment, one exemplary non-volatile memory device is shown. The same reference numerals have been used to identify components which are the same functions as those in the embodiment of FIGS. 3A–3D and will be explained in no more details.

The field oxide layer 3 is formed over a surface of the P-substrate 1. The P-substrate 1 has the N-type diffusion regions 5, 7, 9, and 13 and the first control gate 11 formed thereon. A silicon oxide layer 64 is formed on the first control gate 11 and the N-type diffusion region 13. An allowable thickness range of the silicon oxide layer 64 is between about 200 and about 600 Å. In this embodiment, the silicon oxide layer 64 has a thickness of about 400 Å, for example. The silicon oxide layer 64 forms a second oxide layer for the semiconductor device of the present invention.

The select transistor gate oxide layer 65 is formed over the surface of the P-substrate 1 including the region between the N-type diffusion regions 5 and 7. An allowable thickness range of the select transistor gate oxide layer 65 is between about 200 and about 600 Å. In this embodiment, the select transistor gate oxide layer 65 has a thickness of about 400 Å, for example. A polysilicon select gate 67 is formed on the select transistor gate oxide layer 15. An allowable thickness range of the polysilicon select gate 67 is between about 2500 and about 4500 Å. In this embodiment, the polysilicon select gate 67 has a thickness of about 3500 Å, for example. A silicon oxide layer 69 is formed on the surface of the select gate 67. An allowable thickness range of the silicon oxide layer 69 is between about 100 and about 350 Å. In this embodiment, the silicon oxide layer 69 has a thickness of about 250 Å, for example.

The gate oxide layer 19 for memory is formed on the surface of the P-substrate 1 including the region between the N-type diffusion regions 7 and 9. An allowable thickness range of the gate oxide layer 19 is between about 80 and about 110 Å. In this embodiment, the gate oxide layer 19 has a thickness of about 90 Å, for example. The floating gate 23 of a polysilicon layer is formed over the silicon oxide layer 21, the field oxide layer 3, and the memory gate oxide layer 19. A silicon oxide layer 71 is formed on the surface of the select gate 23. An allowable thickness range of the silicon oxide layer 71 is between about 100 and about 350 Å. In this embodiment, silicon oxide layer 71 has a thickness of about 250 Å, for example. The silicon oxide layer 71 forms a third oxide layer for the semiconductor device of the present invention.

The second control gate 27 of a polysilicon layer is formed over the silicon oxide layer 71 on the floating gate 23 and over the silicon oxide layer 22.

The polysilicon-metal interlayer 29 is formed over the P-substrate 1, the upper portion of the field oxide layer 3, the N-type diffusion regions 5, 7, 9 and 13, the first control gate 11, the select gate 67, the floating gate 23 and the second control gate 27.

The contact holes 31 are formed through the polysilicon-metal interlayer 29, and the silicon oxide layer 21 on the N-type diffusion region 13, and through the polysilicon-metal interlayer 29 on the second control gate 27 disposed on the silicon oxide layer 22. The conductive material 33 is formed inside the contact hole 31 and on a predetermined region within the polysilicon-metal interlayer 29.

In the embodiment shown in FIGS. 13A–13D, the select gate 67 may be formed at the same time or not at the same time the second control gate 27 or the floating gate 23 is formed. One exemplary manufacturing process for forming the select gate 67 simultaneously with the second control gate 27 will be now described.

Referring to FIGS. 13A–13D to 15A–15E, the manufacturing process will be described. FIGS. 14A–14E and 15A–15E are cross-sectional views for explaining an exemplary manufacturing process of the embodiment shown in FIGS. 13A–13D. FIGS. 14A–14E are sections taken along line A–A' of FIG. 10A. FIGS. 15A–15E are sections taken along line B–B' of FIG. 10A.

In Step 1, in a similar manner to the above-mentioned step 1 described with reference to FIGS. 3A and 6A, the field oxide layer 3 and the silicon oxide layer 72 are formed on the P-substrate 1 by the normal LOCOS method to form the resist pattern 37 having an opening of region in which the first control gate is formed. In a similar manner to the above-mentioned Step 2 described with reference to FIGS. 5B and 6B, phosphorous is implanted in regions in which the first control gate of the P-substrate 1 is formed (refer to FIGS. 14A and 15A).

In Step 2, subsequent to removing the resist pattern 37, the resist pattern 73 for covering the regions in which a select transistor gate oxide layer, the first control gate, and the N-type diffusion region 13 are formed, is formed on the silicon oxide layer 72. The resist pattern 73 is masked and the thermal oxidation procedure is conducted to remove all silicon oxide layers except the regions in which the select transistor gate oxide layer, the first control gate, the N-type diffusion region 13, and the field oxide layer 3 are formed (refer to FIGS. 14B and 15B).

In Step 3, after removal of the resist pattern 73, the thermal oxidation procedure is conducted to form a memory gate silicon oxide layer 19, e.g., having a thickness of 90 Å on the surface of the P-substrate 1 uncovered with the field oxide layer 3. At this time, the region in which the select transistor gate oxide layer is formed has a thickened layer of the silicon oxide layer 72 to form the select transistor gate oxide layer 65, e.g., having a thickness of 400 Å. The regions in which the first control gate and the N-type diffusion region 13 are formed have a thickened layer of the silicon oxide layer 72 to form the silicon oxide layer 64, e.g., having a thickness of 400 Å. In addition, the phosphorous implanted into the region in which the first control gate is formed in Step 1 is diffused to form the first control gate 11 including the buried N-type diffusion region. (refer to FIGS. 14C and 15C.)

In Step 4, a polysilicon layer, e.g., having a thickness of 3500 Å is deposited over the P-substrate 1 by the CVD techniques. The polysilicon layer is patterned by the photolithography and etching techniques to form the floating gate 23 over the silicon oxide layer 64 on the first control gate 11, the field oxide layer 3, and the memory gate oxide layer 19, followed by formation of the select gate 67 over the region including the select transistor gate oxide layer 65. Subsequently, the thermal oxidation procedure is conducted to form the silicon oxide layer 69 on the surface of the select gate 67, followed by formation of the silicon oxide layer 71 on the floating gate 23 (refer to FIGS. 14D and 15D).

In Step 5, a polysilicon layer, e.g., having a thickness of 3500 Å is deposited over the P-substrate 1 by the CVD techniques. The polysilicon layer is patterned by the photolithography techniques and etching techniques to form the second floating gate 27 in the region over the silicon oxide layer 71 on the floating gate 23 and the silicon oxide layer 22. In a similar manner to the above-mentioned Step 7 described with reference to FIGS. 5G and 6G, the N-type diffusion regions, 5, 7, 9, and 13 are formed on the P-substrate 1 (refer to FIGS. 14E and 15E).

In Step 6, in a similar manner to the above-mentioned Step 8 described with reference to FIGS. 3A–3D, the polysilicon-metal interlayer 29, the contact holes 31, and the conductive material 33 are formed on the P-substrate 1 (refer to FIGS. 13A–13D).

In this manufacturing process, the silicon oxide layer 25 is formed on the surface of the floating gate 23. However, in a similar manner to the manufacturing process described with reference to FIGS. 7A–7D to 9A–9D, the multilayer film of a silicon oxide layer, a silicon nitride layer, a silicon oxide layer may be disposed on the upper surface of the floating gate 23 to form the silicon layer on the side surface of floating gate 23. In this case, the insulting layer formed on the upper and side surfaces of the floating gate 23 can have different types and thickness, thereby providing flexibility in a high coupling ratio and improving process selectivity.

Numerous additional modifications and variations are possible in light of the above teachings. It is therefore to be understood that within the scope of the appended claims, the disclosure of this patent specification may be practiced otherwise than as specifically described herein.

What is claimed as new and desired to be protected by Letters Patent of the United States is:

1. A non-volatile memory semiconductor device, comprising:
   a first insulation layer formed on a semiconductor substrate;
   two diffusion regions formed on a surface of the semiconductor substrate spaced from each other;
   a memory gate oxide layer formed over the two diffusion regions on the semiconductor substrate between the two diffusion regions;
   a first control gate electrically separated from the two diffusion regions and including a diffusion region formed on the surface of the semiconductor substrate;
   a second insulation layer formed on the first control gate;
   a floating gate of polysilicon formed over the memory gate oxide layer, the first insulation layer, and the second insulation layer;

a third insulation layer formed on the floating gate; and a second control gate disposed on the floating gate electrically connected to the first control gate through the third insulation layer.

2. The non-volatile memory semiconductor device as defined in claim 1, further comprising a fourth insulation layer, wherein the floating gate is disposed under a portion of the second control gate through the fourth insulation layer.

3. The non-volatile memory semiconductor device as defined in claim 1, wherein the third insulation layer comprises a multilayer film including a plurality of layers including at least one silicon nitride layer.

4. The non-volatile memory semiconductor device as defined in claim 3, wherein the multilayer film of the third insulation layer comprises a silicon oxide layer, a silicon nitride layer, a silicon oxide layer sequentially in this order from bottom to top with the silicon oxide layer formed on side surfaces of the floating gate.

5. The non-volatile memory semiconductor device as defined in claim 1, further comprising a tunneling oxide layer having a thickness less than the memory gate oxide layer which is provided on one of the two diffusion regions, wherein a portion of the floating gate is formed on the tunneling oxide layer.

* * * * *